United States Patent
Takamiya

(10) Patent No.: US 7,147,995 B2
(45) Date of Patent: Dec. 12, 2006

(54) DEVELOPING SOLUTION FOR HEAT-SENSITIVE LITHOGRAPHIC PRINTING PLATE PRECURSOR AND METHOD FOR PREPARING LITHOGRAPHIC PRINTING PLATE

(75) Inventor: Shuichi Takamiya, Haibara-gun (JP)

(73) Assignee: Fuji Photo Film Co., Ltd., Minami-Ashigari (JP)

( * ) Notice: Subject to any disclaimer, the term of this patent is extended or adjusted under 35 U.S.C. 154(b) by 48 days.

(21) Appl. No.: 10/798,365

(22) Filed: Mar. 12, 2004

(65) Prior Publication Data

US 2004/0185374 A1    Sep. 23, 2004

(30) Foreign Application Priority Data

Mar. 12, 2003  (JP) .............................. 2003-066120

(51) Int. Cl.
*G03F 7/32* (2006.01)
*G03F 7/30* (2006.01)

(52) U.S. Cl. ................. 430/331; 430/302; 101/465; 101/467

(58) Field of Classification Search ................ 430/302, 430/331, 270.1; 101/465, 467
See application file for complete search history.

(56) References Cited

U.S. PATENT DOCUMENTS 5,670,294 A      9/1997  Piro 6,364,544 B1 *  4/2002  Sasayama et al. .......... 396/578
6,919,166 B1 *  7/2005  Takamiya .................. 430/302

FOREIGN PATENT DOCUMENTS

| EP | 965887 A1 | * 12/1999 |
| EP | 1 231 074 A2 | 8/2002 |
| EP | 1 253 472 A2 | 10/2002 |
| EP | 1 273 971 A2 | 1/2003 |
| EP | 1 276 013 A2 | 1/2003 |
| EP | 1 356 949 A1 | 10/2003 |
| JP | 11-338126 A | 12/1999 |
| JP | 2000-32178 A | 11/2000 |

OTHER PUBLICATIONS

European Patent Office Search Report.

* cited by examiner

*Primary Examiner*—John S. Chu
(74) *Attorney, Agent, or Firm*—Buchanan Ingersoll & Rooney PC

(57) ABSTRACT

An alkaline developing solution for development of a heat-sensitive presensitized plate of positive-working mode for use in making a lithographic printing plate, which developing solution comprises a linear-type alkyleneoxide adduct and a branched-type alkyleneoxide adduct; a method for preparing a lithographic printing plate comprising the steps of light-exposing to infrared radiation, a heat-sensitive presensitized plate of positive-working mode for use in making a lithographic printing plate, said presensitized plate having an image recording layer which comprises an IR-absorbing dye on a substrate, and developing the light-exposed plate with the above alkaline developing solution.

16 Claims, No Drawings

DEVELOPING SOLUTION FOR HEAT-SENSITIVE LITHOGRAPHIC PRINTING PLATE PRECURSOR AND METHOD FOR PREPARING LITHOGRAPHIC PRINTING PLATE

FIELD OF THE INVENTION

The present invention relates to an alkaline developing solution suitable for processing a lithographic printing plate precursor, i.e., a presensitized plate for use in making a lithographic printing plate (hereinafter possibly referred to as "PS plate"), capable of achieving direct plate making, that is, making a printing plate directly by exposing the PS plate to infrared laser scanning based on digital signals from computers or the like. The present invention further relates to a method for preparing a lithographic printing plate from a PS plate which is capable of achieving direct plate making, i.e., making a printing plate directly by infrared laser scanning based on digital signals from computers or the like.

BACKGROUND OF THE INVENTION

Recently, progress of technique on a laser has been remarkable, and particularly, a solid state laser or semiconductor laser having an emission range of from near infrared ray to infrared ray is very useful as a light exposure source in a system wherein a printing plate precursor is directly imaged by digital data, since such laser of high powered and compact type has been easily available.

As an image recording material suitable for laser-writing, for example, a positive-working image recording material has been proposed, and such material comprises (a) a binder such as a cresol resin, (b) a compound which absorbs light so as to generate the heat, and (c) a compound such as quinonediazide which is heat-decomposable, whose pre-decomposition state being capable of substantially decreasing a solubility of said binder.

The mechanism of this material is that on IR radiation, the light-exposed area becomes alkaline-soluble, since the compound (b) generates the heat in the light-exposed area and then the compound (c) is decomposed (i.e., heat-mode type). However, the generated heat is absorbed in some degree by a substrate aluminum plate and so the thermal efficiency of this mechanism is poor, and therefore the solubility of the light-exposed area to an alkaline developing solution is not satisfactory in a development process. Consequently, alkaline strength of a developing solution must be raised to ensure the solubility of the light-exposed area.

On the other hand, in the lithographic printing plate precursor of heat-mode type, the resistance of non-heated areas (i.e., image areas) to dissolution in an alkaline developing solution is poor under the above highly alkaline concentration, and when the image recording material has slightly scratches on the surface thereof, said scratched areas may be easily dissolved. Accordingly, there is a problem such that the image areas, particularly fine line areas and the like are easily impaired. This tendency is particularly serious in a positive-working lithographic printing plate precursor employing a polymeric compound which is highly soluble to an alkaline aqueous solution.

Consequently, the raise in alkaline strength of a developing solution should be limited, though said raise in alkaline strength is intended not to leave undissolved residue on non-image areas, and it is also difficult to form a highly sharp and clear image without impairment to the formed image areas. There is therefore a need for improved sharpness and improved reproducibility of images, particularly fine images comprising a dot pattern, fine lines and the like. For the purpose of meeting the need, addition of various surfactants to a developing solution has been researched, and this attempt can attain an effect to some extent in obtaining sharpness of images.

In this connection, the use of a polyethyleneoxide adduct in an alkaline developing solution has been proposed in for example, Japanese Patent Application Publication (hereunder referred to as "J.P. KOKAI") No. 2000-321788, and the use of a polyoxyalkylene-type nonionic surfactant in an alkaline developing solution has been proposed in for example, J.P. KOKAI No. Hei 11-338126.

However, it becomes a subject of discussion that the above compound which works as a restrainer for image areas will interact with a component in a light-sensitive layer, in particular an alkali-soluble resin, through dissolution of the component from the light-sensitive layer into the developing solution, and so the restrainer's ability to inhibit the image areas from undergoing development is decreased.

SUMMARY OF THE INVENTION

Accordingly, an object of the present invention is to overcome the above conventional drawbacks and provide an alkaline developing solution and a plate making method which can exhibit a certain performance, even if components of an image recording layer dissolve into the developing solution in course of processing, and make possible that a highly sharp and clear image is formed without damages to the formed image areas.

The inventor of the present invention has conducted various studies to accomplish the foregoing objects, and has found that the addition of specific compounds in combination into an alkaline developing solution enables the developing solution to form a highly sharp and clear image in a lithographic printing plate, even if the components in a light-sensitive layer dissolve into the developing solution in course of long-standing processing. The present invention has been thus accomplished.

Consequently, the present invention is directed to an alkaline developing solution for development of a heat-sensitive presensitized plate of positive-working mode for use in making a lithographic printing plate, which developing solution comprises a linear-type alkyleneoxide adduct and a branched-type alkyleneoxide adduct. In a preferable embodiment of the present invention, the alkaline developing solution further comprises at least one selected from the group consisting of anionic surfactants and amphoteric surfactants.

The present invention is also directed to a method for preparing a lithographic printing plate comprising the steps of light-exposing to infrared (IR) radiation, a heat-sensitive presensitized plate of positive-working mode for use in making a lithographic printing plate, said presensitized plate having an image recording layer which comprises an IR-absorbing dye on a substrate, and developing the light-exposed plate with the above developing solution.

DETAILED DESCRIPTION OF THE INVENTION

The alkaline developing solution according to the present invention, which will also be hereinafter referred to as the developing solution simply, will now be explained in detail.

The developing solution of the present invention is an alkaline aqueous solution, which can appropriately be chosen from the conventional alkaline aqueous solutions.

The developing solutions of the present invention include an alkaline aqueous solution comprising an alkali silicate or a nonreducing sugar and a base. The alkaline developing solutions having a pH range from 12.5 to 14.0 are particularly preferable.

The above-mentioned alkali silicate shows alkaline properties when dissolved in water. For example, silicates of alkali metals such as sodium silicate, potassium silicate and lithium silicate, and ammonium silicate can be used. Such alkali silicates may be used alone or in combination.

The developing performance of the alkaline aqueous solution comprising the above-mentioned alkali silicate can easily be controlled by adjusting the mixing ratio of the components constituting the silicate, that is, silicon dioxide ($SiO_2$) and alkali oxide represented by $M_2O$, wherein M is an alkali metal or ammonium group, and the concentration of the alkali silicate.

In the above-mentioned alkaline aqueous solution, it is preferable that the molar ratio of the silicon dioxide ($SiO_2$) to the alkali oxide ($M_2O$) be in the range of 0.5 to 3.0, from the aspect of moderate alkalinity and developing performance, and more preferably 1.0 to 2.0.

The concentration of the alkali silicate in the developing solution is preferably in the range of 1 to 10% by weight from the aspect of developing performance, processing ability and waste fluid treatment, more preferably 3 to 8% by weight, and most preferably 4 to 7% by weight, with respect to the total weight of the alkaline aqueous solution.

In the developing solution comprising a nonreducing sugar and a base, the nonreducing sugars mean sugars having no reducing properties due to the absence of free aldehyde group and ketone group. The nonreducing sugars are classified into trehalose type oligosaccharides prepared by linking reducing groups together, glycosides prepared by joining a reducing group of sugars with non-sugars, and sugar alcohols prepared by reducing sugars with hydrogenation. Any of the above-mentioned nonreducing sugars can preferably be used in the present invention.

The trehalose type oligosaccharides include, for example, saccharose and trehalose; and the glycosides include, for example, alkyl glycoside, phenol glycoside, and mustard oil glycoside.

Examples of the sugar alcohols are D, L-arabitol, ribitol, xylitol, D, L-sorbitol, D, L-mannitol, D, L-iditol, D, L-talitol, meso-inositol, dulcitol, and allodulcitol. Further, maltitol obtained by subjecting disaccharides to hydrogenation and reductants (e.g., reduced starch syrup) obtained by subjecting oligosaccharides to hydrogenation are also preferred.

Among the above-mentioned nonreducing sugars, trehalose type oligosaccharides and sugar alcohols, in particular, saccharose, D-sorbitol, meso-inositol and reduced starch syrup are preferably employed because there can be obtained a buffering action to lead to an adequate pH range.

Those nonreducing sugars may be used alone or in combination. The amount of the nonreducing sugar in the developing solution is preferably in the range of 0.1 to 30% by weight, more preferably 1 to 20% by weight.

The above-mentioned alkali silicate or nonreducing sugar can be used in combination with a base, which may appropriately be selected from the conventional alkaline chemicals, and a pH value of the developing solution can be adjusted.

Examples of the alkaline chemicals include inorganic alkaline agents such as sodium hydroxide, potassium hydroxide, lithium hydroxide, sodium tertiary phosphate, potassium tertiary phosphate, ammonium tertiary phosphate, sodium secondary phosphate, potassium secondary phosphate, ammonium secondary phosphate, sodium carbonate, sodium carbonate, potassium carbonate, ammonium carbonate, sodium bicarbonate, potassium bicarbonate, ammonium bicarbonate, sodium borate, potassium borate and ammonium borate, and potassium citrate, sodium citrate and the like.

In addition to the above, organic alkaline chemicals such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine can also be used.

Those alkaline chemicals may be used alone or in combination.

Among the above-mentioned alkaline chemicals which are suitable are sodium hydroxide and potassium hydroxide. By controlling the amount of the alkaline chemicals such as sodium hydroxide and potassium hydroxide with respect to the nonreducing sugar, the pH value of the developing solution can be determined within a wide range. Further, sodium tertiary phosphate, potassium tertiary phosphate, sodium carbonate and potassium carbonate are also preferable, since they have themselves, buffering action.

The alkaline developing solution according to the present invention is characterized in that it comprises a linear-type alkyleneoxide adduct and a branched-type alkyleneoxide adduct in the above mentioned alkaline aqueous solution.

[Linear-Type Alkyleneoxide Adduct]

The linear-type alkyleneoxide adduct used in the present invention includes the compound represented by the following general formula (I):

R—O-(A)m-(B)n-H           (I)

wherein R represents a hydrogen atom, an alkyl or alkenyl group having carbon atoms of from 1 to 30, or an aryl group having carbon atoms of from 6 to 48, A and B each represents —$CH_2CH_2O$— or —$CH_2CH(CH_3)O$— provided that A and B are different from each other, and m and n each represents 0 or an integer of from 1 to 50 provided that m and n are not zero at the same time.

In the formula (I), the alkyl group or alkenyl group represented by R may be in the form of a linear or branched chain, and the alkyl group, alkyenyl group or aryl group may have a substituent, said substituent including an alkyl group having carbon atoms of from 1 to 20, a halogen atom, an aryl group having carbon atoms of from 6 to 15, an aralkyl group having carbon atoms of from 7 to 17, an alkoxy group having carbon atoms of from 1 to 20, an alkoxy-carbonyl group having carbon atoms of from 2 to 20, an acyl group having carbon atoms of from 2 to 15 and the like.

In the above compounds, when both A and B exist, they may be arrayed in the form of random or block copolymer. In the above compounds, the total of m and n is generally from 2 to 50, preferably from 2 to 30, and more preferably from 2 to 20.

When the above compound has the oxypropylene moiety, it is desirable that the amount of oxypropylene moiety is in the range allowing acceptable water-solubility of the compound.

Specific examples of the linear-type alkyleneoxide adduct represented by the formula (I) are those represented by the following fomulas 1 to 6.

1 HO-(A)m-(B)n-H

2 $C_pH_{2p+1}$—O-(A)m-(B)n-H (wherein p is an integer of from 1 to 30.)

3 $C_qH_{2q-1}$—O-(A)m-(B)n-H (wherein q is an integer of from 2 to 30.)

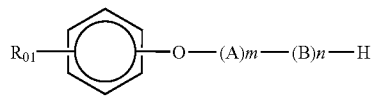

4

(wherein $R_{01}$ represents a hydrogen atom or an alkyl group having carbon atoms of from 1 to 20 which may be in the form of linear or branched chain.)

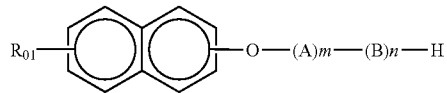

5

(wherein $R_{01}$ represents a hydrogen atom or an alkyl group having carbon atoms of from 1 to 20 which may be in the form of linear or branched chain.)

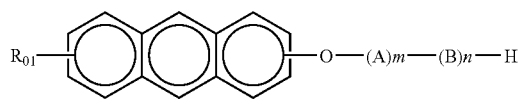

6

(wherein $R_{01}$ represents a hydrogen atom or an alkyl group having carbon atoms of from 1 to 20 which may be in the form of linear or branched chain.)

In the formulas ①~⑥, A, B, m and n are defined as same as in the formula (I).

Among the compounds represented by the formulas ①~⑥, preferred are the compounds represented by the formula ④, more specifically those represented by the formula ④ wherein $R_{01}$ is an alkyl group having carbon atoms of from 1 to 10, preferably from 1 to 4, and more preferably from 1 to 3.

The linear-type alkyleneoxide adduct used in the present invention has generally a molecular weight of from 50 to 10,000 from the aspect of inhibiting sufficiently image areas from dissolving in the developing solution and sufficient development of non-image areas. More specifically, the linear-type alkylene adduct has preferably the molecular weight of from 100 to 5,000, and more preferably from 500 to 3,500.

In the developing solution according to the present invention, the linear-type alkyleneoxide adduct may be used alone or in combination. The amount of the linear-type alkyleneoxide adduct in the alkaline developing solution ranges generally from 0.001 to 10.0% by weight, preferably from 0.01 to 5.0% by weight, and more preferably from 0.05 to 1.0% by weight.

[Branched-Type Alkyleneoxide Adduct]

The branched-type alkyleneoxide adduct herein denotes a compound having in the molecular structure thereof at least two groups represented by the following formula (II):

-(A)m-(B)n-H    (II)

wherein A and B each represents —$CH_2CH_2O$— or —$CH_2CH(CH_3)O$— provided that A and B are different from each other, and m and n each represents 0 or an integer of from 1 to 50 provided that m and n are not zero at the same time. Polyalkylene glycols such as polyethylene glycol, polypropylene glycol and ethyleneoxide/propyleneoxide condensation products are excluded from the branched-type alkyleneoxide adduct.

In the above compound, when both A and B exist, they may be arrayed in the form of random or block copolymer. In the formula (II), the total of m and n is generally from 2 to 50, preferably from 2 to 30, and more preferably from 2 to 20.

Specific examples of the branched-type alkyleneoxide adduct include compound (1) having in the molecular structure thereof at least two of the group: —O-(A)m-(B)n-H wherein A, B, m and n are defined as same as in the formula (II), and compound (2) having in the molecular structure thereof at least one nitrogen atom and at least two of the group: -(A)m-(B)n-H wherein A, B, m and n are defined as same as in the formula (II), said group being attached to the nitrogen atom. In the above compound (2), two or more of the group: -(A)m-(B)n-H may be attached to the same nitrogen atom, or a distinct nitrogen atom.

The branched-type alkyleneoxide adduct used in the present invention has at least two, more specifically not less than 2 and not more than 20, preferably not more than 10, and more preferably not more than 8 of the group represented by the formula (II).

In the branched-type alkyleneoxide adduct, total mole number of added alkyleneoxides is generally from 2 to 200 moles per a molecule, preferably from 2 to 100 moles per a molecule, and more preferably from 2 to 50 moles per a molecule. When the branched-type alkyleneoxide adduct has the oxypropylene moiety, it is desirable that the amount of oxypropylene moiety is in the range allowing acceptable water-solubility of the compound.

More specifically, examples of the branched-type alkyleneoxide adduct used in the present invention are the compound represented by the following formula (III), (IV) or (IV').

<Compound Represented by the Formula (III)>

(III)

wherein r represents an integer of from 1 to 10, and $R_1$, $R_2$ and $R_3$ each represent hydrogen atom or the following formula (II):

-(A)m-(B)n-H    (II)

wherein A and B each represents —$CH_2CH_2O$— or —$CH_2CH(CH_3)O$— provided that A and B are different from each other, and m and n each represents 0 or an integer of from 1 to 50 provided that m and n are not zero at the same time, provided that at least two of $R_1$, $R_2$ and $R_3$ represent the group represented by the formula (II).

In the formula (III), r represents preferably an integer of from 1 to 6, more preferably an integer of from 1 to 4.

Examples of the branched-type alkyleneoxide adduct of the formula (III) include alkyleneoxide adducts of sugar alcohols such as D, L-threitol, D, L-arabitol, ribitol, xylitol, D, L-sorbitol, D, L-mannitol, D, L-iditol, D, L-talitol, dulcitol and allodulcitol, and alkyleneoxide adducts of glycerin. These compounds are generally available in the market, and examples of commercial products thereof include a trade name of, for example, Sorbitol EO(30) manufactured by Nikko Chemicals, Co., Ltd. and the like.

Other examples of the branched-type alkyleneoxide adduct are alkyleneoxide adduct of polyglycerin such as diglycerin, triglycerin, tetraglycerin, pentaglycerin, and hexaglycerin, said polyglycerin being obtained by condensation of sugar alcohols.

<Compound Represented by the Formula (IV) or (IV')>

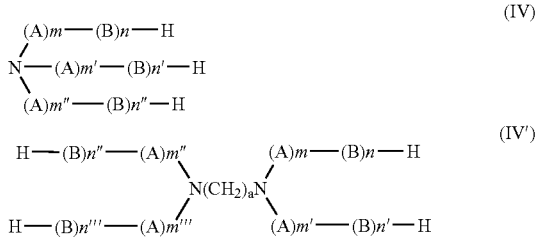

wherein A and B each represents —CH$_2$CH$_2$O— or —CH$_2$CH(CH$_3$)O— provided that A and B are different from each other, and m and n each represents 0 or an integer of from 1 to 50 provided that m and n are not zero at the same time, m' and n' each represents 0 or an integer of from 1 to 50 provided that m' and n' are not zero at the same time, m" and n" each represents 0 or an integer of from 1 to 50 provided that m" and n" are not zero at the same time, and m''' and n''' each represents 0 or an integer of from 1 to 50 provided that m''' and n''' are not zero at the same time, and "a" in the formula (IV') is an integer of from 2 to 12.

Examples of the compound represented by the formula (IV) include an ethyleneoxide (EO) adduct of triethanolamine and the like.

Examples of the branched-type alkyleneoxide adduct represented by the formula (IV') include EO adduct of ethylenediamine, EO/PO (propyleneoxide) adduct of ethylenediamine, PO adduct of ethylenediamine, and compounds listed at commercial product brochures under a trade name of, for example, Tetronic which is manufactured by Asahi Denka Kogyo K.K.

Other examples of the branched-type alkyleneoxide adduct are trimethylolpropyl ether alkyleneoxide adducts such as trimethylolpropyl ether EO adduct, trimethylolpropyl ether EO/PO adduct, and trimethylolpropyl ether PO adduct.

The branched-type alkyleneoxide adduct used in the present invention has generally a molecular weight of from 50 to 10,000 from the aspect of inhibiting sufficiently image areas from dissolving in the developing solution and sufficient development of non-image areas. More specifically, the branched-type alkylene adduct has preferably the molecular weight of from 100 to 5,000, and more preferably from 500 to 3,500.

In the developing solution according to the present invention, the branched-type alkyleneoxide adduct may be used alone or in combination. The amount of the branched-type alkyleneoxide adduct in the alkaline developing solution ranges generally from 0.001 to 10.0% by weight, preferably from 0.01 to 7.5% by weight, and more preferably from 0.05 to 5.0% by weight.

In the developing solution according to the present invention, the total amount of the linear-type alkyleneoxide adduct and the branched-type alkyleneoxide adduct ranges generally from 0.002 to 20.0% by weight, preferably from 0.02 to 12.5% by weight, and more preferably from 0.1 to 6.0% by weight.

The alkaline developing solution according to the present invention may further comprise at least one selected from the group consisting of anionic surfactants and amphoteric surfactants from the aspect of improving dissolution rate of light-exposed areas and inhibiting occurrence of development sludge.

[Anionic Surfactant]

Anionic surfactants which can be used in the present invention preferably include fatty alcohol sulfuric ester salts such as sodium lauryl alcohol sulfate, ammonium lauryl alcohol sulfate and sodium octyl alcohol sulfate, higher alkyl ether sulfate salts, aryl ether sulfate salts, alkyl aryl sulfonate salts such as sodium isopropyl naphthalene sulfonate, sodium isobutyl naphthalene sulfonate, sodium dodecyl benzene sulfonate and sodium metanitro benzene sulfonate, sulfuric esters of fatty alcohol having carbon atoms of from 8 to 22 such as sodium secondary alcohol sulfate, aliphatic alcohol phosphoric ester salts such as sodium cetyl alcohol phosphate, alkyl amide sulfonate salts such as C$_{17}$H$_{33}$CON(CH$_3$)CH$_2$CH$_2$SO$_3$Na, sulfonate salts of bibasic aliphatic ester such as dioctyl sodium sulfosuccinate and dihexyl sodium sulfosuccinate, hydroxyalkane sulfonate salts, alkane sulfonate salts, alkyl diphenylether sulfonate salts, diphenylether disulfonate salts, dialkyl sulfosuccinate salts, olefin sulfonate salts, linear alkyl benzene sulfonate salts, branched alkyl benzene sulfonate salts, alkyl naphthalene sulfonate salts, alkyl phenoxy polyoxyethylene propyl sulfonate salts, polyoxyethylene alkyl sulfophenylether salts, disodium N-alkyl sulfosuccinate monoamide, petroleum sulfonates, and the like.

Among these, preferred are aromatic anionic surfactants including the compounds represented by the following formula (V), (VI), (VII) or (VIII).

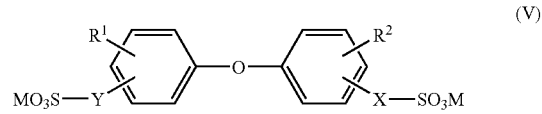

In the formula (V), R$^1$ and R$^2$ independently represent hydrogen atom or an alkyl group which may be in the form of linear or branched chain, X and Y independently represent a single bond or a formula: —O—(CH$_2$CH$_2$O)n- (n is an integer of from 1 to 100.), and M represents a monovalent alkali metal.

In the formula (V), an alkyl group represented by R$^1$ or R$^2$ has generally carbon atoms of from 1 to 40, preferably from 2 to 20, and more preferably from 4 to 12, and X and Y independently represent a single bond or a formula: —O—(CH$_2$CH$_2$O)n- (n is preferably an integer of from 2 to 50, and more preferably from 3 to 30.), and M represents generally sodium, potassium or lithium, and preferably sodium.

Preferable examples of the compounds represented by the formula (V) are the compounds represented by the following formula (1), (2) or (3).

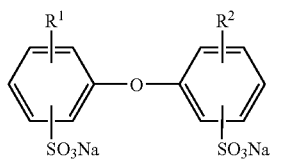
(1)

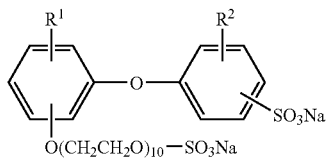
(2)

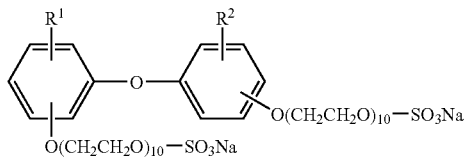
(3)

In the above formula (1), (2) or (3), specific example of $R^1$ or $R^2$ is particularly $nC_8H_{17}$ and $nC_{12}H_{25}$.

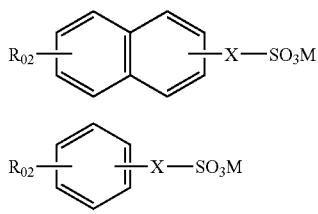
(VI)
(VII)

In the above formula (VI) or (VII), $R_{O2}$ represents hydrogen atom or an alkyl group which may be in the form of linear or branched chain, X represents a single bond or a formula: —O—(CH$_2$CH$_2$O)n- (n is an integer of from 1 to 100.), and M represents a monovalent alkali metal.

In the formula (VI), an alkyl group represented by $R_{O2}$ has generally carbon atoms of from 1 to 40, preferably from 2 to 20, and more preferably from 4 to 12, and X represents a single bond or a formula: —O—(CH$_2$CH$_2$O)n- (n is preferably an integer of from 2 to 50, and more preferably from 3 to 30.), and M represents generally sodium, potassium or lithium, and preferably sodium.

Preferable examples of the compounds represented by the formula (VI) are the compounds represented by the following formula (4) or (5).

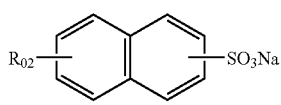
(4)

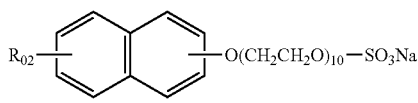
(5)

In the above formula (4) or (5), specific example of $R_{O2}$ is particularly $nC_8H_{17}$ and $nC_{12}H_{25}$.

In the formula (VII), an alkyl group represented by $R_{O2}$ has generally carbon atoms of from 1 to 40, preferably from 2 to 20, and more preferably from 4 to 12, and X represents a single bond or a formula: —O—(CH$_2$CH$_2$O)n- (n is preferably an integer of from 2 to 50, and more preferably from 3 to 30.), and M represents generally sodium, potassium or lithium, and preferably sodium.

Preferable examples of the compounds represented by the formula (VII) are the compounds represented by the following formula (6) or (7).

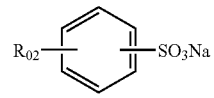
(6)

(7)

In the above formula (6) or (7), specific example of $R_{O2}$ is particularly $nC_8H_{17}$ and $nC_{12}H_{25}$.

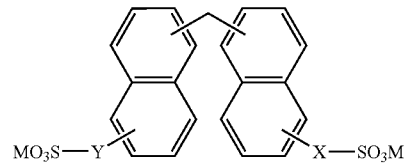
(VIII)

In the formula (VIII), X and Y independently represent a single bond or a formula: —O—(CH$_2$CH$_2$O)n- (n is an integer of from 1 to 100.), and M represents a monovalent alkali metal.

In the formula (VIII), X and Y independently represent a single bond or a formula: —O—(CH$_2$CH$_2$O)n- (n is preferably an integer of from 2 to 50, and more preferably from 3 to 30.), and M represents generally sodium, potassium or lithium, and preferably sodium.

Preferable examples of the compounds represented by the formula (VIII) are the compounds represented by the following formula (8), (9) or (10).

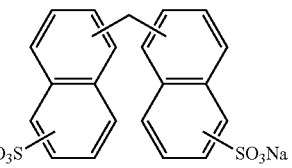
(8)

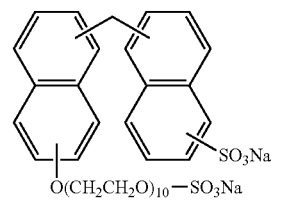
(9)

-continued

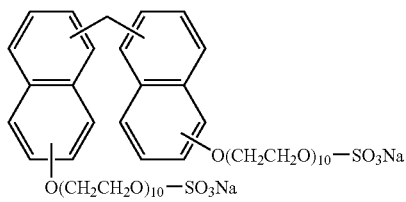
(10)

Among the compounds represented by the formulas (V)~(VIII), the compounds represented by the formula (V) are preferable.

Specific examples of aromatic-type anionic surfactants are as follows.

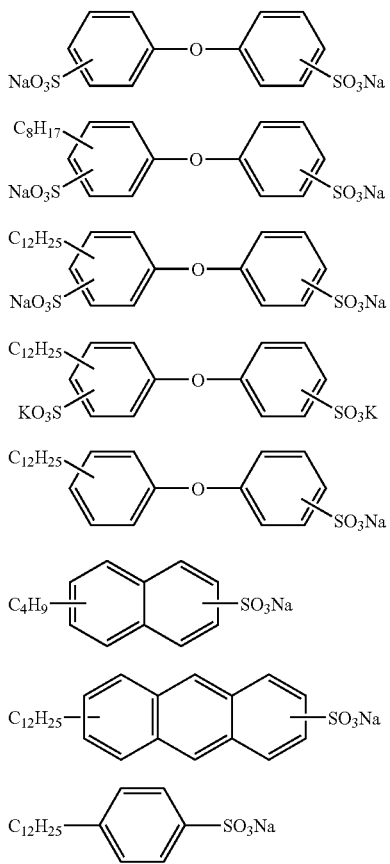

[Amphoteric Surfactant]

The amphoteric surfactant which can be used in the present invention includes amino acid-type amphoteric surfactants and betaine-type amphoteric surfactants, etc.

Examples of the amino acid-type amphoteric surfactants are compounds represented by the following formula (IX) or (X):

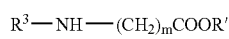
(IX)

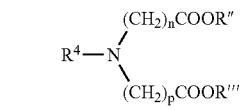
(X)

wherein each $R^3$ and $R^4$ represents a hydrocarbon group having carbon atoms of from 2 to 30, and each R', R" and R'" represents a hydrogen atom or a monovalent alkali metal, and each m, n and p represents an integer of from 1 to 10.

In the above formula (IX), $R^3$ represents preferably a hydrocarbon group having atoms of from 3 to 20 and preferably from 4 to 12, and generally an aliphatic hydrocarbon group which may be a straight chain or branched chain, preferably a straight chain, and may be saturated or unsaturated, and specifically an alkyl or alkenyl group. R' represents a hydrogen atom, or a monovalent alkali metal including sodium, potassium and lithium, preferably sodium. The symbol m represents an integer of from 1 to 10, preferably from 2 to 8 and more preferably from 2 to 6.

A preferred example of the compound represented by the formula (IX) is the one represented by the following formula (11).

(11)

In the formula (11), the specific example of $R^3$ includes $nC_8H_{17}$, $nC_{12}H_{25}$ and the like.

In the formula (X), $R^4$ represents preferably a hydrocarbon group having atoms of from 3 to 20 and preferably from 4 to 12, and generally an aliphatic hydrocarbon group which may be a straight chain or branched chain, preferably a straight chain, and may be saturated or unsaturated, and specifically an alkyl or alkenyl group. Each of R" and R'" represents a hydrogen atom, or a monovalent alkali metal including sodium, potassium and lithium, preferably sodium. The symbols n and p independently represent an integer of from 1 to 10, preferably from 2 to 8 and more preferably from 2 to 6.

A preferred example of the compound represented by the formula (X) is the one represented by the following formula (12).

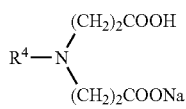
(12)

In the formula (12), the specific example of $R^4$ includes $nC_8H_{17}$, $nC_{12}H_{25}$ and the like.

Among the compounds represented by the formula (IX) or (X), the one represented by the formula (X) is preferable.

The above compounds may be prepared by a conventional method. Such compounds are also available in the market, for example, as a commercial product under a trade name of PIONIN C-158 manufactured by Takemoto Yushi, Co., Ltd.

On the other hand, examples of betaine-type amphoteric surfactants include the compounds represented by the following formula (XI):

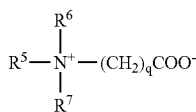

wherein $R^5$, $R^6$ and $R^7$ independently represent a hydrocarbon group having carbon atoms of from 1 to 30, and q represents an integer of from 1 to 10.

In the formula (XI), $R^5$, $R^6$ and $R^7$ each represents preferably a hydrocarbon group having atoms of from 1 to 20 and preferably from 1 to 12, and generally an aliphatic hydrocarbon group which may be a straight chain or branched chain, preferably a straight chain, and may be saturated or unsaturated, and specifically an alkyl or alkenyl group. The symbol q represents an integer of from 1 to 10, preferably from 2 to 8 and more preferably from 2 to 6.

A preferred example of the compound represented by the formula (XI) is the one represented by the following formula (13).

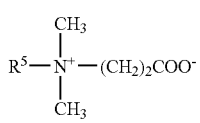

In the formula (13), the specific example of $R^5$ includes $nC_8H_{17}$, $nC_{12}H_{25}$ and the like.

Other examples of the amphoteric surfactants include imidazolinium salts, imidazolines and sulfobetaines.

In the alkaline developing solution of the present invention, any one compound or any combination of two or more compounds selected from the group consisting of anionic surfactants and amphoteric surfactants may be used. The amount of at least one compound selected from the group consisting of anionic surfactants and amphoteric surfactants in the alkaline developing solution ranges generally from 0.001 to 10% by weight, in the aspect of inhibiting occurrence of insoluble matter in the developing solution during the process of development and favorable developing performance. The amount is preferably from 0.005 to 1% by weight, and more preferably from 0.01 to 0.5% by weight.

The alkaline developing solution comprises an alkaline silicate or a nonreducing sugar, and a base, as described above. As the cationic component thereof, $Li^+$, $Na^+$, $K^+$ and $NH_4^+$ are conventionally used. In particular, a developing solution system comprising lot of the cation which has a small ionic radius is highly penetrative to an image recording layer, such system being excellent in developing performance, however, the system also dissolves the image area and causes impairment of the image. Accordingly, the increase of alkaline concentration should be limited to a certain extent, and it is in need of setting of subtle liquid condition in order that simultaneously impairment of the image and the image recording layer which is left on non-image areas (undissolved residue) may not be generated.

However, the use of cation which has relatively large ionic radius in a developing solution inhibits the penetration of developing solution into an image recording layer, and so it is possible to improve an inhibitive power against the solubility of image areas without decrease of alkaline concentration, i.e., without decrease of the developing performance.

As the cationic component, other cations than alkaline metal cations and ammonium cation may be used.

The alkaline developing solution according to the present invention may further comprise various additives as shown below in order to enhance the developing performance more effectively.

The additives include, for example, a neutral salt such as NaCl, KCl and KBr as disclosed in JP KOKAI No. Sho 58-75152, a chelating agent such as EDTA and NTA as disclosed in JP KOKAI No. Sho 58-190952; a complex such as $[Co(NH_3)_6]Cl_3$ and $CoCl_2.6H_2O$ as disclosed in JP KOKAI No. Sho 59-121336; anion or amphoteric surfactants such as sodium alkyl naphthalene sulfonate, N-tetradecyl-N,N-dihydroxyethyl betaine and the like as disclosed in JP KOKAI No. Sho 50-51324; a nonionic surfactant such as tetramethyldecyne diol as disclosed in U.S. Pat. No. 4,374,920; a cationic polymer such as methyl chloride quaternary compounds of p-dimethylaminomethyl polystyrene as disclosed in JP KOKAI No. Sho 55-95946; a polymeric ampholyte such as a copolymer of vinylbenzyltrimethylammonium chloride and sodium acrylate as disclosed in JP KOKAI No. Sho 56-142528; a reducing inorganic salt such as sodium sulfite as disclosed in JP KOKAI No. Sho 57-192951; an inorganic lithium compound such as lithium chloride as disclosed in JP KOKAI No. Sho 58-59444; an organic metal-containing surfactant such as surfactants containing organic silicon or titanium as disclosed in JP KOKAI No. Sho 59-75255; an organic boron compound as disclosed in JP KOKAI No. Sho 59-84241; and a quaternary ammonium salt such as tetraalkylammonium oxide as disclosed in EP 101,010.

The embodiment where the alkaline developing solution of the present invention is employed is not particularly Limited. To rationalize and standardize the process of making a printing plate in the fields of plate making and printing, automatic processors have widely been used to produce printing plates in recent years. Typically, the automatic processor comprises a development unit and a post-treatment unit, including an apparatus for transporting a PS plate, containers for various kinds of treatment liquids, and apparatuses for spraying the liquids onto the PS plate. While the PS plate that has been exposed to light image is horizontally transported in the automatic processor, each treatment liquid is drawn up from the container using a pump and sprayed onto the PS plate through the spray nozzle, thereby achieving the development. There is also known a method of treating the PS plate by immersing the PS plate in a treatment liquid held in the container while transporting the PS plate along a guide roll provided in the container.

Such an automatic processor can achieve continuous development operation by replenishing the treatment liquids in respective containers according to the amount consumed and the operating time. In this case, large quantities of PS plates can be treated without any replacement of the developing solution in a developer container over a long period of time by adding to the developing solution a replenisher controlled to have an alkalinity higher than that of the developing solution. In the embodiments where the alkaline developing solution of the present invention is employed, the above-mentioned replenishing system is preferably used. Basically, the replenisher may have the same formulation as that of the alkaline developing solution mentioned above.

The aforementioned developing solution and replenisher therefor may further comprise diverse surfactants and organic solvents, if necessary, in order to appropriately control the developing performance, enhance the dispersion properties of sludge in the developing solution, and increase the ink receptivity of the image portion to be formed in the printing plate.

Such surfactant may be selected from nonionic, cationic, anionic or amphoteric surfactants other than those described above.

Benzyl alcohol or the like is preferred as the above-mentioned organic solvent. In addition, it is also preferable to add polyethylene glycol or derivatives thereof, and polypropylene glycol or derivatives thereof.

Furthermore, when necessary, the developing solution and replenisher may comprise hydroquinone, resorcin, an inorganic salt type reducing agent such as sodium sulfite or hydrogensulfite and potassium sulfite or hydrogensulfite, an organic carboxylic acid, an antifoaming agent, and a water softener.

A lithographic printing plate obtained by processing a PS plate with the alkaline developing solution according to the present invention and optionally a replenisher may be further subjected to post-treatments with any of washing-water, a rinsing solution which commonly comprises a surfactant and a desensitizing gum solution which comprises for instance, gum arabic and starch derivatives. The plates can be subjected to any combination of these post-treatments.

Not only the above-mentioned development process, but also the development process using only a substantially fresh developing solution, that is, a throwaway developing solution, can be applied to the method of making a printing plate according to the present invention.

[Heat-Sensitive Presensitized Plate of Positive-Working Mode for Use in Making a Lithographic Printing Plate]

The heat-sensitive PS plate used in the present invention has a construction wherein an image recording layer comprising an IR-absorbing dye as an essential component and optionally an alkali-soluble resin and the like is provided on a substrate to make a lithographic printing plate.

Then, the heat-sensitive PS plate of positive-working mode will hereunder be described in detail below. At first, the constitution of a heat-sensitive layer which works as an image recording layer in the PS plate will be explained.

[IR-Absorbing Dye]

IR-absorbing dyes used in the heat-sensitive layer according to the present invention is not limited to specific ones, provided that is a dye which is capable of absorbing infrared ray and generating heat, and include various dyes which are known in the art as an IR-absorbing dye.

The IR-absorbing dye materials may be commercially available ones or those known in the literature (see, for instance, "SENRYO BINRAN", edited by YUKI GOSEI KAGAKU KYOKAI, Published in Showa 45 (1970)) and specific examples thereof are azo dyes, metal complex azo dyes, pyrazolone azo dyes, quinoneimine dyes, methine dyes, cyanine dyes, and the like. Among them, the ones capable of absorbing infrared ray or near infrared ray are suitable, since they can be used suitably with a laser emitting infrared ray or near infrared ray.

Examples of such dyes which absorbing infrared ray or near infrared ray include cyanine dyes such as those disclosed in, for example, Japanese Un-Examined Patent Publication Nos. Sho 58-125246, Sho 59-84356, Sho 59-202829 and Sho 60-78787; methine dyes such as those disclosed in, for instance, Japanese Un-Examined Patent Publication Nos. Sho 58-173696, Sho 58-181690 and Sho 58-194595; naphthoquinone dyes such as those disclosed in, for instance, Japanese Un-Examined Patent Publication Nos. Sho 58-112793, Sho 58-224793, Sho 59-48187, Sho 59-73996, Sho 60-52940 and Sho 60-63744; squarylium dyes such as those described in, for instance, Japanese Un-Examined Patent Publication No. Sho 58-112792; and cyanine dyes such as those disclosed in, for instance, G.B. Patent No. 434,875.

Preferably used as the dye herein also include, for instance, sensitizing agents capable of absorbing near infrared rays disclosed in U.S. Pat. No. 5,156,938; substituted arylbenzo (thio) pyrylium salts disclosed in U.S. Pat. No. 3,881,924; trimethine thiopyrylium salts disclosed in Japanese Un-Examined Patent Publication No. Sho 57-142645 (U.S. Pat. No. 4,327,169); pyrylium compounds disclosed in Japanese Un-Examined Patent Publication Nos. Sho 58-181051, Sho 58-220143, Sho 59-41363, Sho 59-84248, Sho 59-84249, Sho 59-146063 and 59-146061; cyanine dyes disclosed in Japanese Un-Examined Patent Publication No. Sho 59-2 16146; pentamethine thiopyrium salts disclosed in U.S. Pat. No. 4,283,475; pyrylium compounds disclosed in Japanese Examined Patent Publication Nos. Hei 5-1 3514 and Hei 5-19702; and commercially available ones such as Epolight III-178, Epolight III-130, Epolight III-125 and like (available from Epoline Company).

Preferably used in the heat-sensitive layer also include dyes such as those represented by the general formulas (I) and (II) disclosed in U.S. Pat. No. 4,756,993. Said dye exhibits remarkably strong interaction with an alkali-soluble resin, and therefore it is excellent in resistance to alkali-development of the unexposed area in the heat-sensitive layer.

The content of the dye in the heat-sensitive layer ranges from 3 to 50% by weight from the aspect of sensitivity and durability of the heat-sensitive layer, preferably from 5 to 40% by weight and more preferably from 8 to 35% by weight on the basis of total weight of the heat-sensitive layer.

Specific examples of the IR-absorbing dye are shown below, but the present invention is not restricted to these specific compounds.

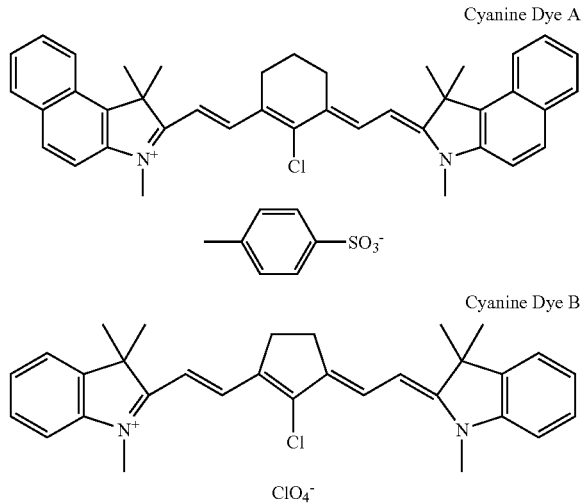

Cyanine Dye A

Cyanine Dye B

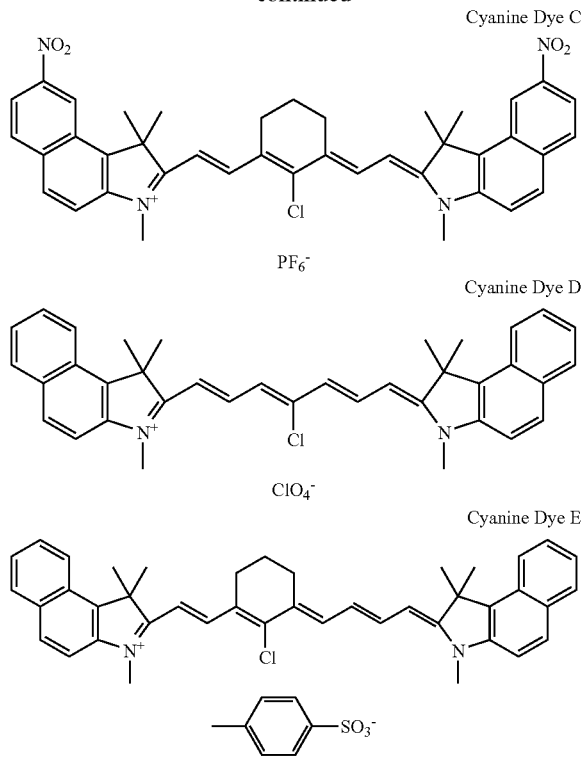

[Alkali-Soluble Resin]

The alkali-soluble resin used in the heat-sensitive layer is a resin that is insoluble in water and soluble in alkaline solutions, which will also be referred to as an alkali-soluble polymer hereinafter, and includes homopolymers having an acidic group in the main chain and/or side chain thereof, and copolymers or mixtures thereof. Therefore, one of the features of the heat-sensitive layer is that this layer is dissolved in an alkaline developing solution when come in contact therewith.

Any conventional alkali-soluble polymers can be used in the heat-sensitive layer. It is preferable that the employed polymers have in the molecule thereof at least one functional group selected from the group consisting of: (1) phenolic hydroxyl group, (2) sulfonamide group, and (3) active imide group.

The following polymers can be given as examples, but the alkali-soluble polymer for use in the present invention is not limited to the following examples.

(1) Examples of the alkali-soluble polymers having a phenolic hydroxyl group are as follows: novolak resins such as phenol—formaldehyde resin, m-cresol—formaldehyde resin, p-cresol—formaldehyde resin, (mixture of m-cresol and p-cresol)—formaldehyde resin, and mixture of phenol and cresol (m-cresol and/or p-cresol)—formaldehyde resin; and pyrogallolacetone resins. In addition to the above alkali-soluble polymers having a phenolic hydroxyl group, polymers having a phenolic hydroxyl group in the side chain thereof are preferably used. Such polymers having a phenolic hydroxyl group in the side chain thereof can be obtained by homopolymerization of a polymerizable monomer which is composed of a low-molecular compound comprising at least one phenolic hydroxyl group and at least one polymerizable unsaturated bond, or copolymerization of the above-mentioned monomer with other polymerizable monomers.

Examples of the polymerizable monomer having a phenolic hydroxyl group used to obtain the polymers having a phenolic hydroxyl group in the side chain thereof include phenolic hydroxyl group-containing acrylamide, methacrylamide, acrylic ester, methacrylic ester, and hydroxystyrene. Specific examples of the above-mentioned polymerizable monomer include N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, and 2-(4-hydroxyphenyl)ethyl methacrylate.

The above-mentioned phenolic hydroxyl group-containing resins may be used alone or in combination. Moreover, copolymers of phenol having as a substituent an alkyl group with 3 to 8 carbon atoms and formaldehyde, such as t-butylphenol—formaldehyde resin and octylphenol—formaldehyde resin may be used together, as disclosed in U.S. Pat. No. 4,123,279.

(2) The alkali-soluble polymers having a sulfonamide group include polymers obtained by homopolymerization of a sulfonamide group-containing polymerizable monomer or copolymerization of the above polymerizable monomer and other polymerizable monomers. The sulfonamide group-containing polymerizable monomer is composed of a low-molecular compound having in one molecule thereof at least (i) one sulfonamide group (—NH—SO$_2$—) wherein at least one hydrogen atom is bonded to nitrogen atom, and (ii) at least one polymerizable unsaturated bond. In particular, low-molecular compounds having acryloyl group, allyl group or vinyloxy group, and substituted- or monosubstituted-aminosulfonyl group or substituted-sulfonylimino group are preferably used.

(3) With respect to the active imide group-containing alkali-soluble polymers, polymers having an active imide group in the molecule thereof are preferable. Such polymers can be obtained by homopolymerization of a polymerizable monomer which is composed of a low-molecular compound having in the molecule thereof one or more active imide groups and one or more polymerizable unsaturated bonds, or copolymerization of the above-mentioned monomer with other polymerizable monomers.

Preferable examples of the active imide group-containing polymers are N-(p-toluenesulfonyl)methacrylamide and N-(p-toluenesulfonyl)acrylamide.

Moreover, preferably employed are polymers obtained by polymerizing two or more polymerizable monomers selected from the group consisting of the above-mentioned phenol group-containing polymerizable monomers, sulfonamide group-containing polymerizable monomers, and active imide group-containing polymerizable monomers, and polymers obtained by subjecting the above-mentioned two or more polymerizable monomers to copolymerization with other polymerizable monomers. In the case where the phenolic hydroxyl group-containing polymerizable monomer (M1) is subjected to copolymerization with the sulfonamide group-containing polymerizable monomer (M2) and/or the active imide group-containing polymerizable monomer (M3), the ratio by weight of M1 to M2 and/or M3 is preferably in the range of (50:50) to (5:95), more preferably in the range of (40:60) to (10:90).

In the case where the alkali-soluble polymer is a copolymer consisting of one monomer unit selected from the above-mentioned monomers having groups such as (1) phenol group, (2) sulfonamide group, and (3) active imide group and another monomer unit of other polymerizable monomers, it is preferable that the monomer unit which imparts the alkali-solubility to the polymer be contained in an amount of 10 mol % or more from the aspect of obtaining sufficient alkali-solubility to expand development latitude, more preferably 20 mol % or more, in the obtained copolymer.

The monomer components that can be used for copolymerization with the above-mentioned polymerizable phenolic hydroxyl group-containing monomers, sulfonamide group-containing monomers, and active imide group-containing monomers are classified into the following groups (m1) to (m12). However, the monomer components are not limited to the following examples.

(m1): Acrylic esters and methacrylic esters having an aliphatic hydroxyl group, such as 2-hydroxyethyl acrylate and 2-hydroxyethyl methacrylate.

(m2): Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, and glycidyl acrylate.

(m3): Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, and glycidyl methacrylate.

(m4): Acrylamides and methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide.

(m5): Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(m6): Vinyl esters such as vinyl acetate, vinyl chloroacetate, vinyl butyrate, and vinyl benzoate.

(m7): Styrenes such as styrene, α-methylstyrene, methylstyrene, and chloromethylstyrene.

(m8): Vinyl ketones such as methyl vinyl ketone, ethyl vinyl ketone, propyl vinyl ketone, and phenyl vinyl ketone.

(m9): Olefins such as ethylene, propylene, isobutylene, butadiene, and isoprene.

(m10): N-vinylpyrrolidone, acrylonitrile, and methacrylonitrile.

(m11): Unsaturated imides such as maleimide, N-acryloylacrylamide, N-acetylmethacrylamide, N-propionylmethacrylamide, and N-(p-chlorobenzoyl)methacrylamide.

(m12): Unsaturated carboxylic acids such as acrylic acid, methacrylic acid, maleic anhydride, and itaconic acid.

The alkali-soluble polymer for use in the present invention is preferably those having a phenolic hydroxyl group, from the aspect of superiority thereof in image-forming ability by light-exposure on an infrared laser and the like. Said polymer includes preferably novolak resins such as phenol—formaldehyde resin, m-cresol—formaldehyde resin, p-cresol—formaldehyde resin, (mixture of m-cresol and p-cresol)—formaldehyde resin, and mixture of phenol and cresol (m-cresol and/or p-cresol)—formaldehyde resin; and pyrogallolacetone resins.

Further, examples of the alkali-soluble polymer having a phenolic hydroxyl group include a polycondensation product of phenol and formaldehyde possessing a substituent of alkyl group having carbon atoms of from 3 to 8, such as t-butylphenol—formaldehyde resin and octylphenol-formaldehyde resin, as disclosed in U.S. Pat. No. 4,123,279.

A method for copolymerization to obtain alkali-soluble polymers may be any of well-known processes, such as graft copolymerization, block copolymerization, random copolymerization and the like.

In the case where the alkali-soluble polymer for use in the present invention is a homopolymer of the above-mentioned phenolic hydroxyl group-containing polymerizable monomer, sulfonamide group-containing polymerizable monomer, or active imide group-containing polymerizable monomer, or a copolymer comprising the above-mentioned polymerizable monomer, the weight-average molecular weight (Mw) of the obtained polymer may be preferably 2,000 or more, more preferably in the range of 5,000 to 300,000, and the number-average molecular weight (Mn) of the obtained polymer may be preferably 500 or more, more preferably in the range of 800 to 250,000. The polydispersity (Mw/Mn) is desirably in the range of 1.1 to 10.

In the case where the alkali-soluble polymer is a resin such as phenol—formaldehyde resin, cresol—aldehyde resin or the like, the polymer with a weight-average molecular weight of 500 to 20,000 and a number-average molecular weight of 200 to 10,000 is preferably used.

In the heat-sensitive layer, the above-mentioned alkali-soluble polymers may be used alone or in combination. In the heat-sensitive layer, the alkali-soluble polymer may be contained in an amount of 30 to 99% by weight with respect to the total solid content of the heat-sensitive layer, from the aspect of durability and sensitivity of the heat-sensitive layer. The amount of alkali-soluble polymer is preferably from 40 to 95% by weight, and more preferably from 50 to 90% by weight.

Further, an alkali-soluble polymer having a carboxyl group (hereinafter referred to as (B1) component) can be used in combination with the above polymer. The (B1) component may be any of alkali-soluble polymer having a carboxyl group, and preferred are the polymers (b1-1) and (b1-2) which are defined below.

—(b1'-1) Alkali-Soluble Polymer Having a Polymerizable Monomer Unit Represented by the Following General Formula (i) —

wherein Xm represents a single bond or a bivalent connecting group, Y represents hydrogen atom or a carboxyl group, and Z represents hydrogen atom, alkyl or carboxyl group.

A monomer constructing the monomer unit of the formula (i) includes a polymerizable monomer having at least one carboxyl group and at least one polymerizable unsaturated group in the molecule thereof. Specific examples of the polymerizable monomer are α, β-unsaturated carboxylic acids such as acrylic acid, methacrylic acid, maleic acid, maleic anhydride, itaconic acid, itaconic anhydride and the like.

A monomer which is copolymerized with the above polymerizable monomer having a carboxyl group includes those listed below as (1) to (11), but the present invention is not restricted to these specific ones at all:

(1) acrylic acid esters and methacrylic acid esters each carrying an aliphatic hydroxyl group such as 2-hydroxyethyl acrylate and 2-hydroxyethyl methacrylate;
(2) alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate and N-dimethylaminoethyl acrylate;
(3) alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate and N-dimethylaminoethyl methacrylate;
(4) acrylamides or methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide and N-ethyl-N-phenyl acrylamide;
(5) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;
(6) vinyl esters such as vinyl acetate, vinyl chloroacetate, vinyl butyrate and vinyl benzoate;
(7) styrenes such as styrene, α-methyl styrene, methyl styrene and chloromethyl styrene;
(8) vinyl ketones such as methyl vinyl ketone, ethyl vinyl ketone, propyl vinyl ketone and phenyl vinyl ketone;
(9) olefins such as ethylene, propylene, isobutylene, butadiene and isoprene;
(10) N-vinyl pyrrolidone, N-vinyl carbazole, 4-vinyl pyridine, acrylonitrile, methacrylonitrile or the like;
(11) unsaturated imides such as maleimide, N-acryloyl acrylamide, N-acetyl methacrylamide, N-propionyl methacrylamide and N-(p-chlorobenzoyl) methacrylamide.

Alternatively, a monomer represented by the following general formula (ii) may be preferably used.

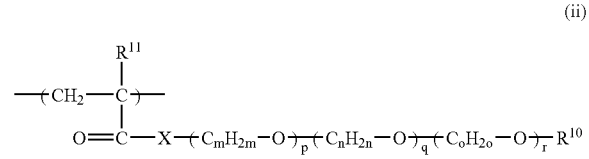

wherein X represents O, S or N—$R^{12}$; $R^{10}$ to $R^{12}$ represent each independently hydrogen atom or an alkyl group; m, n and o represent each independently an integer of from 2 to 5; $C_mH_{2m}$, $C_nH_{2n}$ and $C_oH_{2o}$ are independently in the form of linear or branched chain; p, q and r represent each independently an integer of from 0 to 3,000, and p+q+r>2.

The alkyl group represented by $R^{10}$ to $R^{12}$ is preferably an alkyl group having 1 to 12 carbon atoms, and specifically includes methyl, ethyl, n-propyl and isopropyl groups and the like. In the formula, p, q and r represent preferably an integer of from 0 to 500, and more preferably from 0 to 100.

Examples of monomers corresponding to the repeating unit represented by the formula (ii) are listed below, but the present invention is not restricted to these specific ones at all.

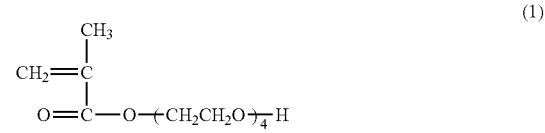

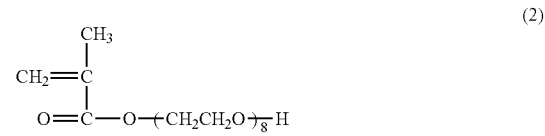

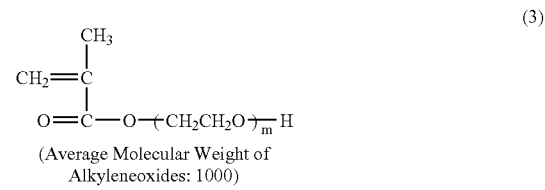

(Average Molecular Weight of Alkyleneoxides: 1000)

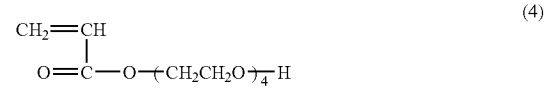

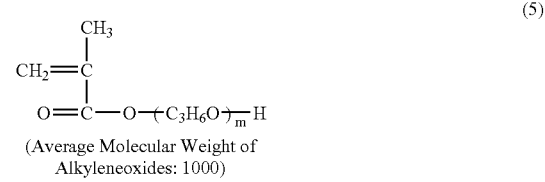

(Average Molecular Weight of Alkyleneoxides: 1000)

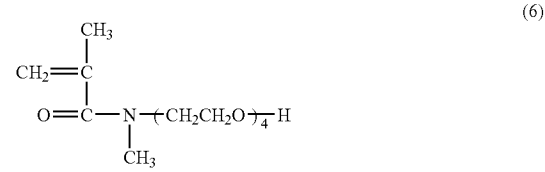

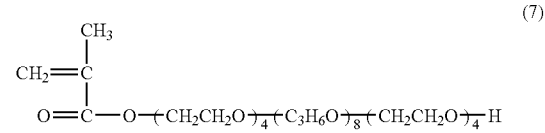

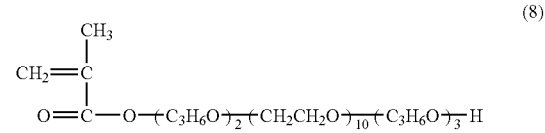

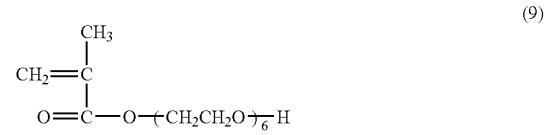

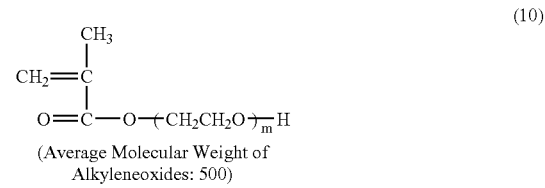

(Average Molecular Weight of Alkyleneoxides: 500)

-continued

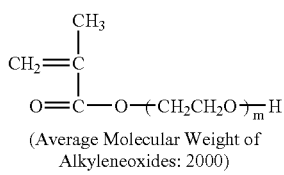
(Average Molecular Weight of Alkyleneoxides: 2000)

(11)

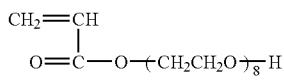

(12)

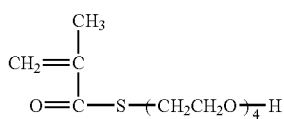
(Average Molecular Weight of Alkyleneoxides: 1500)

(13)

$$CH_2=C(CH_3)-C(=O)-S-(CH_2CH_2O)_4-H$$

(14)

The repeating unit represented by the formula (ii) can be prepared by reacting a commercially available hydioxy poly(oxyalkylene) material such as Pluronic (trade name) manufactured by Asahi Dennka Kogyo Co., Ltd., AdekaPolyether (trade name) manufactured by Asahi Dennka Kogyo Co., Ltd., Carbowax (trade name) manufactured by Glyco Products, Toriton (trade name) manufactured by Rohm and Haas and P.E.G manufactured by Dai-icbi Kogyo Seiyaku Co., Ltd., with acrylic acid, methacrylic acid, acrylchloride, methacrylchloride, acrylic anhydride or the like in a well known method.

Alternatively, poly(oxyalkylene) diacrylate can be used, which is prepared by a well known method.

Commercially available monomers include a hydroxyl-terminated polyalkylene glycol mono(meth)acrylate manufactured by Nippon Yushi Co., Ltd. such as Blenmer PE-90, Blenmer PE-200, Blenmer PE-350, Blenmer AE-90, Blenmer AE-200, Blenmer AE-400, Blenmer PP- 1000, Blenmer PP-500, Blenmer PP-800, Blenmer AP- 150, Blenmer AP-400, Blenmer AP-550, Blenmer AP-800, Blenmer 50PEP-300, Blenmer 70PEP-350B, Blenmer AEP Series, Blenmer 55PET-400, Blenmer 30OPET-800, Blenmer 55PET-800, Blenmer AET Series, Blenmer 3PPT-800, Blenmer 5OPPT-800, Blenmer 70PPT-800, Blenmer APT Series, Blenmer 10PPB-500B, Blenmer 10APB-500B and the like. Similarly, there are an alkyl-terminated polyalkylene glycol mono(meth)acrylate manufactured by Nippon Yushi Co., Ltd. such as Blenmer PME-100, Blenmer PME-200, Blenmer PME-400, Blenmer PME-1000, Blenmer PME-4000, BlenmerAME-400, Blenmer 50POEP-800B, Blenmer 50AOEP-800B, Blenmer PLE-200, Blenmer ALE-200, Blenmer ALE-800, Blenmer PSE-400, Blenmer PSE-1300, Blenmer ASEP Series, Blenmer PKEP Series, Blenmer AKEP Series, Blenmer ANE-300, Blenmer ANE-1300, Blenmer PNEP Series, Blenmer PNPE Series, Blenmer 43 ANEP-500, Blenmer 70ANEP-550, and products manufactured by Kyoei Chemicals Co., Ltd. such as Light Ester MC, Light Ester 130MA, Light Esters 041MA, Light Acrylate BO-A, Light Acrylate EC-A, Light Acrylate MTG-A, Light Acrylate 130A, Light Acrylate DPM-A, Light Acrylate P-200A, Light Acrylate NP-4EA, Light Acrylate NP-8EA and the like.

The minimum constitutional unit in the polymer (b1-1), which has the polymerizable monomer component having at least one carboxyl group and at least one polymerizable unsaturated group may be alone, or two or more in combination. It is possible to use the compound obtained by copolymerizing two or more minimum constitutional units having the same acidic group, or two or more minimum constitutional units having different acidic groups. A method which is usable for copolymerization may be a conventional method such as a graft copolymerization, a block copolymerization, a random copolymerization and the like.

—(b1-2) Alkali-Soluble Polymer Having a Carboxyl Group, Which has as a Basic Skeleton, a Reaction Product of a Diol Compound Having a Carboxyl Group Represented by the Following General Formula (iii), (iv) or (v) and a Diisocyanate Compound Represented by the Following Formula (viii)—

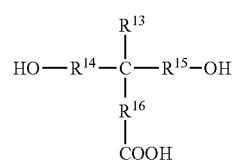

(iii)

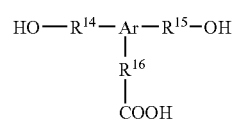

(iv)

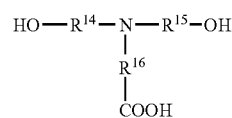

(v)

wherein $R^{13}$ represents hydrogen atom, or an alkyl, alkenyl, aralkyl, aryl, alkoxy or aryloxy group which may have a substituent such as alkyl, aryl, alkoxy, ester, urethane, amide, ureido and halogeno group, and preferably hydrogen atom, an alkyl group having 1 to 8 carbon atoms, an alkenyl group having 2 to 8 carbon atoms, and an aryl group having 6 to 15 carbon atoms; $R^{14}$ $R^{15}$ and $R^{16}$, which may be the same or different, each represent a single bond, a bivalent aliphatic or aromatic hydrocarbon group which may have a substituent such as alkyl, alkenyl, aralkyl, aryl, alkoxy and halogeno group, preferably an alkylene group having 1 to 20 carbon atoms and an arylene group having 6 to 15 carbon atoms, and more preferably an alkylene group having 1 to 8 carbon atoms.

Where necessary, $R^{14}$, $R^{15}$ and $R^{16}$ may have additionally a functional group which is not reactive to an isocyanate group, such as ester group, urethane group, amide group, ureido group and unsaturated bond between carbons. Two or three of $R^{13}$, $R^{14}$, $R^{15}$ and $R^{16}$ may form a ring together.

Ar represents a trivalent aromatic hydrocarbon group which may have a substituent, and preferably an aromatic group having 6 to 15 carbon atoms.

$$OCN-R^{18}-NCO$$ (viii)

wherein $R^{18}$ represents a bivalent aliphatic or aromatic hydrocarbon group which may have a substituent such as alkyl, alkenyl, aralkyl, aryl, alkoxy and halogeno group. Where necessary, $R^{18}$ may have additionally a functional group which is not reactive to an isocyanate group, such as ester group, urethane group, amide group, ureido group and unsaturated bond between carbons.

The diol compound having a carboxyl group represented by the formula (iii), (iv) or (v) includes 3,5-dihydroxy benzoic acid, 2,2-bis(hydroxymethyl) propionic acid, 2,2-bis(2-hydroxyethyl) propionic acid, 2,2-bis(3-hydroxypropyl) propionic acid, bis(hydroxymethyl) acetic acid, bis(4-hydroxyphenyl) acetic acid, 4,4-bis(4-hydoxyphenyl) pentanoic acid, tartaric acid, N,N-bis(2-hydroxyethyl)-3-carboxy-propionamide, and the like.

The alkali-soluble polymer having a carboxyl group (b1-2) is preferably a reaction product wherein a diol compound represented the following general formula (vi) or (vii) is combined.

(vi)

(vii)

wherein $R^{17}$ each represents hydrogen atom or an alkyl group having 1 to 8 carbon atoms, n represents an integer of 2 or more. The alkyl group having 1 to 8 carbon atoms represented by $R^{17}$ includes methyl, ethyl, isopropyl, n-butyl and isobutyl groups.

Specific examples of the diol represented by the formula (vi) or (vii) are shown below, but the present invention is not restricted to these specific ones at all.

Examples of the compound represented by the formula (vi):

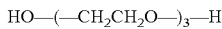

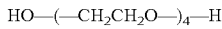

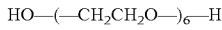

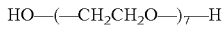

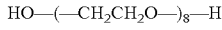

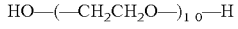

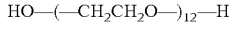

Polyethylene glycol (average molecular weight: 1000)

Polyethylene glycol (average molecular weight: 2000)

Polyethylene glycol (average molecular weight: 4000)

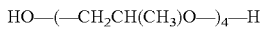

Polypropylene glycol (average molecular weight: 1000)

Polypropylene glycol (average molecular weight: 2000)

Polypropylene glycol (average molecular weight: 4000)

Examples of the compound represented by the formula (vii):

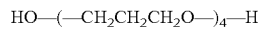

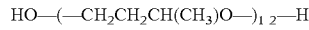

Specific examples of the diisocyanate compound represented by the formula (viii) are aromatic diisocyanate compounds such as 2,4-tolylenediisocyanate, dimer of 2,4-tolylenediisocyanate, 2,6-tolylenediisocyanate, p-xylylenediisocyanate, m-xylylenediisocyanate, 4,4'-diphenylmethan diisocyanate, 1,5-naphthalene diisocyanate and 3,3'-dimethylbiphenyl-4,4'-diisocyanate, aliphatic diisocyanate compounds such as hexamethylene diisocyanate, trimethylhexamethylene diisocyanate, lysine diisocyanate and dimer acid diisocyanate, aliphatic diisocyanate compounds such as isophorone diisocyanate, 4,4'-methylene bis(cyclohexylisocyanate), methylcyclohexane-2,4(2,6)-diisocyanate and 1,3-(isocyanate methyl)cyclohexane, and a reaction product of a diol and a diisocyanate such as an adduct of 1 mole of 1,3-butylene glycol and 2 moles of tolylenediisocyanate.

In the synthesis of the polymer (b1-2), a molar ratio of the diisocyanate compound and the diol compound which are used is preferably from 0.8:1 to 1.2:1. When an isocyanate group remains at the terminal of polymers obtained, the polymer can be treated with alcohols or amines to finally synthesize ones free of an isocyanate group.

As the component (B1), any one or any combination of at least two selected from the polymers (b1-1) and (b 1-2) can be used.

The amount of the repeating unit having a carboxyl group in the component (B1) is generally 2 mol % or more on the basis of the total monomeric amount in the component (B1), preferably from 2 to 70 mol %, and more preferably from 5 to 60 mol %.

The component (B1) has preferably a weight-average molecular weight of from 3,000 to 300,000, and more preferably from 6,000 to 100,000.

The amount of the compound (B1) in the image recording layer ranges generally from 0.005 to 80% by weight with respect to total solid content of the image recording layer from the aspect of desired effect and performance of the image recording material such as sensitivity. The amount of the compound (B1) is preferably from 0.01 to 50% by weight, and more preferably from 1 to 20% by weight.

[Other Additives]

For the formation of the image recording layer, a variety of additives may be used if necessary, in addition to the above-mentioned components so as not to impair the effects of the present invention.

—Compound Capable of Inhibiting the Solubility of Image Recording Material in Developing Solution—

In the heat-sensitive PS plate for lithographic printing for use in the present invention, the heat-sensitive layer may further comprise a variety of inhibitors that can inhibit the alkali-soluble polymer from easily dissolving in the developing solution. The above-mentioned inhibitors are not particularly limited, and quaternary ammonium salts and polyethylene glycol compounds can be used.

The quaternary ammonium salts are not particularly limited, but include tetraalkyl ammonium salt, trialkylauryl ammonium salt, dialkyldiaryl ammonium salt, alkyltriaryl ammonium salt, tetraaryl ammonium salt, cyclic ammonium salt, and bicyclic ammonium salt.

Specific examples of the quaternary ammonium salts are tetrabutyl ammonium bromide, tetrapentyl ammonium bromide, tetrahexyl ammonium bromide, tetraoctyl ammonium bromide, tetralauryl ammonium bromide, tetraphenyl ammonium bromide, tetranaphthyl ammonium bromide, tetrabutyl ammonium chloride, tetrabutyl ammonium iodide, tetrastearyl ammonium bromide, lauryl trimethyl ammonium bromide, stearyl trimethyl ammonium bromide, behenyl trimethyl ammonium bromide, lauryl triethyl ammonium bromide, phenyl trimethyl ammonium bromide, 3-trifluoromethylphenyl trimethyl ammonium bromide, benzyl trimethyl ammonium bromide, dibenzyl dimethyl ammonium bromide, distearyl dimethyl ammonium bromide, tristearylmethyl ammonium bromide, benzyltriethyl ammonium bromide, hydroxyphenyl trimethyl ammonium bromide, and N-methylpyridinium bromide. In particular, quaternary ammonium salts described in JP KOKAI Nos. 2003-107688 and 2003-167332 are preferably used.

It is preferable that the quaternary ammonium salt serving as the above-mentioned inhibitor be contained in the image recording layer in an amount of 0.1 to 50% by weight from the aspect of sufficient inhibiting effect and no adverse effect on film-forming properties of binders, more preferably 1 to 30% by weight, in terms of the solid content with respect to the total weight of the solid content of the image recording layer.

The polyethylene glycol compound used as the aforementioned inhibitor is not particularly limited. The polyethylene glycol with the following structure is preferably employed in the present invention.

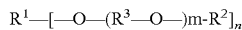

$R^1-[-O-(R^3-O-)m-R^2]_n$ wherein $R^1$ is a residue of a polyhydric alcohol or polyhydric phenol; $R^2$ is a hydrogen atom, or an alkyl group, an alkenyl group, an alkynyl group, alkyloyl group, an aryl group, or an aryloyl group, which has 1 to 25 carbon atoms and may have a substituent; $R^3$ is a residue of an alkylene group which may have a substituent; m is 10 or more on average; and n is an integer of 1 to 4.

Examples of the polyethylene glycol compounds having the above-mentioned structure include polyethylene glycols, polypropylene glycols, polyethylene glycol alkyl ethers, polypropylene glycol alkyl ethers, polyethylene glycol aryl ethers, polypropylene glycol aryl ethers, polyethylene glycol alkylaryl ethers, polypropylene glycol alkylaryl ethers, polyethylene glycol glycerin esters, polypropylene glycol glycerin esters, polyethylene glycol sorbitol esters, polypropylene glycol sorbitol esters, polyethylene glycol fatty acid esters, polypropylene glycol fatty acid esters, polyethylene glycol ethylenediamines, polypropylene glycol ethylenediamines, polyethylene glycol diethylenetriamines, and polypropylene glycol diethylenetriamines.

Specific examples of the above-mentioned polyethylene glycol compounds are polyethylene glycol 1000, polyethylene glycol 2000, polyethylene glycol 4000, polyethylene glycol 10000, polyethylene glycol 20000, polyethylene glycol 50000, polyethylene glycol 100000, polyethylene glycol 200000, polyethylene glycol 500000, polypropylene glycol 1500, polypropylene glycol 3000, polypropylene glycol 4000, polyethylene glycol methyl ether, polyethylene glycol ethyl ether, polyethylene glycol phenyl ether, polyethylene glycol dimethyl ether, polyethylene glycol diethyl ether, polyethylene glycol diphenyl ether, polyethylene glycol lauryl ether, polyethylene glycol dilauryl ether, polyethylene glycol nonyl ether, polyethylene glycol cetyl ether, polyethylene glycol stearyl ether, polyethylene glycol distearyl ether, polyethylene glycol behenyl ether, polyethylene glycol dibehenyl ether, polypropylene glycol methyl ether, polypropylene glycol ethyl ether, polypropylene glycol phenyl ether, polypropylene glycol dimethyl ether, polypropylene glycol diethyl ether, polypropylene glycol diphenyl ether, polypropylene glycol lauryl ether, polypropylene glycol dilauryl ether, polypropylene glycol nonyl ether, polyethylene glycol acetyl ester, polyethylene glycol diacetyl ester, polyethylene glycol benzoic ester, polyethylene glycol lauryl ester, polyethylene glycol dilauryl ester, polyethylene glycol nonylic ester, polyethylene glycol cetylic ester, polyethylene glycol stearoyl ester, polyethylene glycol distearoyl ester, polyethylene glycol behenic ester, polyethylene glycol dibehenic ester, polypropylene glycol acetyl ester, polypropylene glycol diacetyl ester, polypropylene glycol benzoic ester, polypropylene glycol dibenzoic ester, polypropylene glycol lauryl ester, polypropylene glycol dilauryl ester, polypropylene glycol nonylic ester, polyethylene glycol glycerin ether, polypropylene glycol glycerin ether, polyethylene glycol sorbitol ether, polypropylene glycol sorbitol ether, polyethylene glycol ethylenediamine, polypropylene glycol ethylenediamine, polyethylene glycol diethylenetriamine, polypropylene glycol diethylenetriamine, and polyethylene glycol pentamethylenehexamine.

The amount of the polyethylene glycol compound may be in the range of 0.1 to 50% by weight from the aspect of sufficient inhibiting effect and no adverse effect on film-forming properties of binders, preferably 1 to 30% by weight, in terms of the solid content with respect to the total weight of the solid content for use in the image recording layer.

The decrease in sensitivity, which is caused when the solubility of the alkali-soluble polymer in the developing solution is inhibited as mentioned above, can effectively be avoided by the addition of a lactone compound. When the developing solution permeates through the light-exposed portion of the image recording layer, the lactone compound reacts with the developing solution to form a carboxylic acid compound, which will contribute to dissolving of the light-exposed portion of the image recording layer. Thus, the decrease in sensitivity can be prevented.

The lactone compound for use in the present invention is not particularly limited. For example, lactone compounds represented by the following formulas (L-I) and (L-II) can be used.

In the above formulas (L-I) and (L-II), $X^1$, $X^2$, $X^3$ and $X^4$ are each an atom or a group for forming a ring, which may be the same or different and independently have a substituent. At least one of $X^1$, $X^2$ or $X^3$ in the formula (L-I), and at least one of $X^1$, $X^2$, $X^3$ or $X^4$ in the formula (L-II) have an electron attractive substituent or a substituent having an electron attractive substituent.

The atoms or groups represented by $X^1$, $X^2$, $X^3$ and $X^4$ which constitute the ring are each a non-metallic atom having two single bonds or a group including the above-mentioned non-metallic atom for forming the ring.

Preferable non-metallic atoms and preferable groups including the non-metallic atoms are methylene group, sulfinyl group, carbonyl group, thiocarbonyl group, sulfonyl group, sulfur atom, oxygen atom, and selenium atom. In particular, methylene group, carbonyl group and sulfonyl group are preferably used.

As mentioned above, at least one of $X^1$, $X^2$ or $X^3$ in the formula (L-I), and at least one of $X^1$, $X^2$, $X^3$ or $X^4$ in the formula (L-II) have an electron attractive group. The electron attractive group herein used is a group where the Hammett's substituent constant represented by σ ρ is positive. For the Hammett's substituent constant, Journal of Medicinal Chemistry, 1973, vol. 16, No. 11, 1207-1216 can serve as a reference. Examples of the electron attractive group where the Hammett's substituent constant represented by σ ρ is a positive value include a halogen atom such as fluorine atom (σ ρ value of 0.06), chlorine atom (σ ρ value of 0.23), bromine atom (σ ρ value of 0.23) and iodine atom (σ ρ value of 0.18); trihaloalkyl group such as tribromomethyl group (σ ρ value of 0.29), trichloromethyl group (σ ρ value of 0.33) and trifluoromethyl group (σ ρ value of 0.54); cyano group (σ ρ value of 0.66); nitro group (σ ρ value of 0.78); aliphatic, aryl or heterocyclic sulfonyl group such as methanesulfonyl group (σ ρ value of 0.72); aliphatic, aryl or heterocyclic acyl group such as acetyl group (σ ρ value of 0.50) and benzoyl group (σ ρ value of 0.43); alkynyl group such as C≡CH group (σ ρ value of 0.23); aliphatic, aryl or heterocyclic oxycarbonyl group such as methoxycarbonyl group (σ ρ value of 0.45) and phenoxycarbonyl group (σ ρ value of 0.44); carbamoyl group (σ ρ value of 0.36); sulfamoyl group (σ ρ value of 0.57); sulfoxide group; heterocyclic group; oxo group; and phosphoryl group.

Preferable examples of the electron attractive groups are amide group, azo group, nitro group, fluoroalkyl group having 1 to 5 carbon atoms, nitrile group, alkoxycarbonyl group having 1 to 5 carbon atoms, acyl group having 1 to 5 carbon atoms, alkylsulfonyl group having 1 to 9 carbon atoms, arylsulfonyl group having 6 to 9 carbon atoms, alkylsulfinyl group having 1 to 9 carbon atoms, arylsulfinyl group having 6 to 9 carbon atoms, arylcarbonyl group having 6 to 9 carbon atoms, thiocarbonyl group, fluorine-containing alkyl group having 1 to 9 carbon atoms, fluorine-containing aryl group having 6 to 9 carbon atoms, fluorine-containing allyl group having 3 to 9 carbon atoms, oxo group, and halogen atoms.

Among the above groups, more preferably used are nitro group, fluoroalkyl group having 1 to 5 carbon atoms, nitrile group, alkoxycarbonyl group having 1 to 5 carbon atoms, acyl group having 1 to 5 carbon atoms, arylsulfonyl group having 6 to 9 carbon atoms, arylcarbonyl group having 6 to 9 carbon atoms, oxo group, and halogen atoms.

Specific examples of the compounds represented by formulas (L-I) and (L-II) are shown as follows. However, the lactone compounds for use in the present invention are not limited to the following examples.

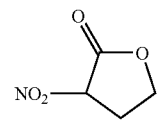
(LI-1)

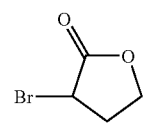
(LI-1)

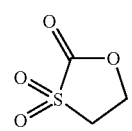
(LI-3)

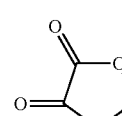
(LI-4)

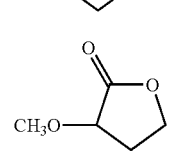
(LI-5)

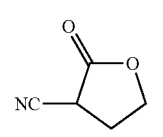
(LI-6)

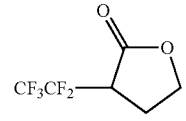
(LI-7)

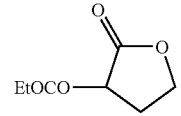
(LI-8)

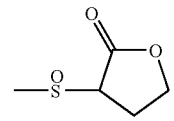
(LI-9)

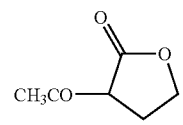
(LI-10)

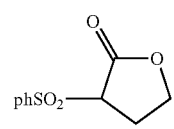
(LI-11)

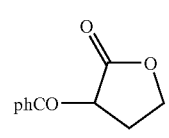
(LI-12)

-continued (LI-13) 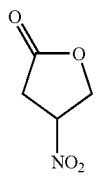

(LI-14) 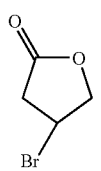

(LI-15) 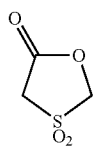

(LI-16) 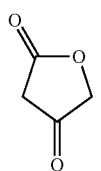

(LI-17) 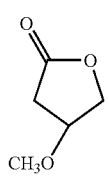

(LI-18) 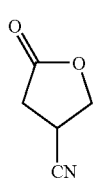

(LI-19) 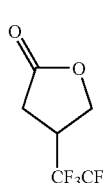

(LI-20) 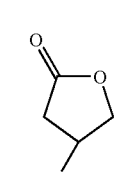

(LI-21) 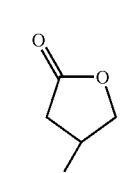

-continued (LI-22) 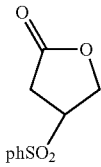

(LI-23) 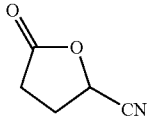

(LI-24) 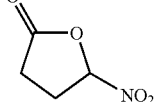

(LII-1) 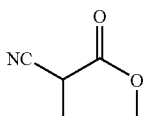

(LII-2) 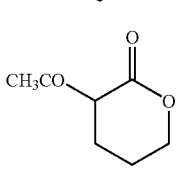

The lactone compound represented by formulas (L-I) and (L-II) may be contained in the image recording layer in an amount of 0.1 to 50% by weight from the aspect of satisfactory effect and image-forming performance, preferably 1 to 30% by weight, in terms of the solid content with respect to the total weight of the solid content of the image recording layer. It is desirable that the lactone compound be selectively brought into contact with the developing solution to cause the reaction therewith.

The above-mentioned lactone compounds may be used alone or in combination. Further, two or more kinds of lactone compounds having formula (L-I) and two or more kinds of lactone compounds having formula (L-II) may be used together at an arbitrary mixing ratio so that the total weight of the lactone compounds is within the above-mentioned range.

Moreover, to further effectively inhibit the non-light exposed portion of the image recording layer from unfavorably dissolving in the developing solution, it is also preferable to use materials which can be pyrolytically decomposed and can substantially decrease the solubility of the alkali-soluble polymer in the alkaline developing solution before pyrolytical decomposition. Such materials include onium salts, o-quinonediazide compounds, aromatic sulfone compounds, and aromatic sulfonic acid ester compounds and the like. The onium salts include diazonium salt, ammonium salt, phosphonium salt, iodonium salt, sulfonium salt, selenonium salt, arsonium salt and the like.

More specifically, preferable examples of the onium salts are diazonium salts described in S. I. Schlesinger, Photogr. Sci. Eng., 18, 387 (1974), T. S. Bal et al., Polymer, 21, 423 (1980), and JP KOKAI No. Hei 5-158230; ammonium salts described in U.S. Pat. Nos. 4,069,055 and 4,069,056, and JP KOKAI No. Hei 3-140140; phosphonium salts described in D. C. Necker et al., Macromolecules, 17, 2468 (1984), C. S. Wen et al., Teh, Proc. Conf. Rad. Curing ASIA, p478 Tokyo, Oct (1988), and U.S. Pat. Nos. 4,069,055 and 4,069,056; iodonium salts described in J. V. Crivello et al., Macromolecules, 10(6), 1307 (1977), Chem. & Eng. News, Nov. 28, p31 (1988), EP 104,143, U.S. Pat. Nos. 339,049 and 410, 201, and JP KOKAI Nos. Hei 2-150848 and 2-296514; sulfonium salts described in J. V. Crivello et al., Polymer J. 17, 73 (1985), J. V Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14(5), 1141 (1981), J. V. Crivello et al., J. Polymer Sci., Polymer Chem. Ed., 17, 2877 (1979), EP 370,693, EP 233,567, EP 297,443, EP 297,442, U.S. Pat. Nos. 4,933,377, 3,902,114, 410, 201, 339,049, 4,760,013, 4,734,444 and 2,833,827, and DP Nos. 2,904,626, 3,604,580 and 3,604,581; selenonium salts described in J. V. Crivello et al., Macromolecules, 10(6), 1307 (1977), and J. V Crivello et al., J. Polymer Sci., Polymer Chem. Ed., 17, 1047 (1979); and arsonium salts described in C. S. Wen et al., Teh, Proc. Conf. Rad. Curing ASIA, p478 Tokyo, Oct (1988).

Of those onium salts, preferably used are diazonium salts, in particular, diazonium salts disclosed in JP KOKAI No. Hei 5-158230.

As the counter ions for the onium salts, tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, paratoluenesulfonic acid and the like can be employed. In particular, hexafluorophosphoric acid and alkyl aromatic sulfonic acid such as triisopropylnaphthalenesulfonic acid and 2,5-dimethylbenzenesulfonic acid are preferably used.

Suitable quinonediazide compounds for use in the present invention include o-quinonediazide compounds. The o-quinonediazide compound for use in the present invention is a compound having at least one o-quinonediazide group, which compound can exhibit increased alkali-solubility by pyrolysis. There can be employed o-quinonediazide compounds with various structures. The o-quinonediazide compounds herein used can contribute to the solubility characteristics of the image recording layer because the o-quinonediazide compounds have the characteristics that they lose the force to inhibit the binder agent from dissolving in the developing solution and the o-quinonediazide compounds themselves turns into alkali-soluble materials when thermally decomposed. For example, the o-quinonediazide compounds described in J. Kosar "Light-sensitive Systems" (John Wiley & Sons. Inc.) pp. 339–352 can be used in the present invention. In particular, sulfonic esters of o-quinonediazide compounds or sulfonamides obtained by the reaction with a variety of aromatic polyhydroxyl compounds or aromatic amino compounds are preferable. In addition, esters of benzoquinone-(1,2)-diazidesulfonic acid chloride or naphthoquinone-(1,2)-diazide-5-sulfonic acid chloride with pyrogallol-acetone resin as described in JP KOKOKU No. Sho 43-28403; and esters of benzoquinone-(1,2)-diazidesulfonic acid chloride or naphthoquinone-(1,2)-diazide-5-sulfonic acid chloride with phenol-formaldehyde resin as described in U.S. Pat. Nos. 3,046,120 and 3,188,210 are also preferably used in the present invention.

Similarly, esters of naphthoquinone-(1,2)-diazide-4-sulfonic acid chloride with phenol-formaldehyde resin or cresol-formaldehyde resin, and esters of naphthoquinone-(1,2)-diazide-4-sulfonic acid chloride with pyrogallol-acetone resin can also be preferably employed. Other suitable o-quinonediazide compounds are described in many patent specifications, for example, JP KOKAI Nos. Sho 47-5303, 48-63802, 48-63803, 48-96575, 49-38701 and 48-13354, JP KOKOKU Nos. Sho 41-11222, 45-9610 and 49-17481, U.S. Pat. Nos. 2,797,213, 3,454,400, 3,544,323, 3,573,917, 3,674,495 and 3,785,825, BP Nos. 1,227,602, 1,251,345, 1,267,005, 1,329,888 and 1,330,932, and DP No. 854,890.

It is preferable that the o-quinonediazide compound be contained in an amount of 1 to 50% by weight, more preferably 5 to 30% by weight, and most preferably 10 to 30% by weight, with respect to the total solid content of the image recording layer. The above-mentioned o-quinonediazide compounds may be used alone or in combination.

The image recording layer may further comprise the alkali-soluble resin wherein at least a part thereof is esterified, said resin being described in JP KOKAI No. Hei 11-288089.

To more effectively inhibit the alkali-soluble polymer from dissolving in the developing solution, and at the same time, to impart the increased scratch resistance to the surface portion of the image recording layer, it is preferable that the image recording layer further comprise polymers including a (meth)acrylate monomer having two or three perfluoroalkyl groups with 3 to 20 carbon atoms in the molecule thereof, as described in JP KOKAI No. 2000-187318. Such a polymer may be contained in an amount of 0.1 to 10% by weight, more preferably 0.5 to 5% by weight of the total weight of materials for the image recording layer.

—Development Promoting Agent—

The heat-sensitive layer of the PS plate may further comprise acid anhydrides, phenolics and organic acids to improve the sensitivity.

With respect to the acid anhydrides, cyclic acid anhydrides are preferable. More specifically, the cyclic acid anhydrides include phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic anhydride, α-phenyl maleic anhydride, succinic anhydride, and pyromellitic anhydride disclosed in U.S. Pat. No. 4,115,128. Non-cyclic acid anhydrides include acetic anhydride.

Examples of the phenolics for use in the present invention are bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane.

The organic acids include sulfonic acids, sulfinic acids, alkylsulfuric acids, phosphonic acids, phosphoric esters, and carboxylic acids as described in JP KOKAI Nos. Sho 60-88942 and Hei 2-96755. Specific examples of the organic acids are p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

It is preferable that the above-mentioned acid anhydrides, phenolics and organic acids be contained in an amount of 0.05 to 20% by weight, more preferably 0.1 to 15% by weight, and most preferably 0.1 to 10% by weight, with respect to the total weight of the image recording layer.

—Surfactant—

The heat-sensitive layer may further comprise nonionic surfactants as described in JP KOKAI Nos. Sho 62-251740 and Hei 3-208514, ampholytic surfactants as described in JP KOKAI Nos. Sho 59-121044 and Hei 4-13149, siloxane compounds as described in EP 950,517, and copolymers comprising a fluorine-containing monomer as described in JP KOKAI Nos. Sho 62-170950, Hei 11-288093 and 2003-57820 to upgrade the coating properties and ensure the stable operation depending upon the development conditions.

Specific examples of the nonionic surfactants are sorbitan tristearate, sorbitan monopalmitate, sorbitan trioleate, stearic acid monoglyceride, and polyoxyethylene nonylphenyl ether. Specific examples of the ampholytic surfactants are alkyldi(aminoethyl)glycine, alkylpolyaminoethylglycine hydrochloride, 2-alkyl-N-carboxyethyl-N-hydroxyethyl imidazolimum betaine, and N-tetradecyl-N,N-betaine (e.g., "Amogen" (trade name) made by Dai-Ichi Kogyo Seiyaku Co., Ltd.).

Block copolymers of dimethyl siloxane and polyalkylene oxide are preferably employed as the siloxane compounds. More specifically, commercially available polyalkylene oxide modified silicone products such as "DBE-224", "DBE-621", "DBE-712", "DBP-732" and "DBP-534", made by Chisso Corporation; and "Tego Glide 100" (trade name), made by Tego Chemie Service GmbH can preferably be employed in the present invention.

It is preferable that the amount of the above-mentioned nonionic surfactants and ampholytic surfactants be in the range of 0.01 to 15% by weight, more preferably 0.1 to 5% by weight, and most preferably 0.05 to 0.5% by weight, with respect to the total weight of materials for the image recording layer.

—Printing-Out Agent/Coloring Agent—

The heat-sensitive layer of the PS plate for use in the present invention may comprise a printing-out agent and a coloring agent for images such as a dye and a pigment to obtain visible images immediately after the image recording layer is heated by light exposure.

One of the representative examples of the printing-out agent is a combination of a compound capable of generating an acid when heated by light exposure and an organic dye capable of forming a salt together with the above-mentioned acid-generating compound. Examples of such a printing-out agent include the combination of o-naphthoquinonediazide-4-sulfonic acid halogenide with a salt-forming organic dye disclosed in JP KOKAI Nos. Sho 50-36209 and 53-8128, and the combination of a trihalomethyl compound with a salt-forming organic dye disclosed in JP KOKAI Nos. Sho 53-36223, 54-74728, 60-3626, 61-143748, 61-151644 and 63-58440. The above-mentioned trihalomethyl compound includes oxazole compounds and triazine compounds, both of which can exhibit excellent stability with time and produce clear printed-out images.

The coloring agent for forming image portions includes not only the above-mentioned salt-forming organic dyes, but also other dyes. Preferable dyes including the salt-forming organic dyes are classified into oil-soluble dyes and basic dyes. Specific examples of such dyes are Oil Yellow #101, Oil Yellow #103, Oil Pink #312, Oil Green BG, Oil Blue BOS, Oil Blue #603, Oil Black BY, Oil Black BS, and Oil Black T-505, which are made by Orient Chemical Industries, Ltd.; and Victoria Pure Blue, Crystal Violet Lactone, Crystal Violet (CI 42555), Methyl Violet (CI 42535), Ethyl Violet, Rhodamine B (CI 145170B), Malachite Green (CI 42000), and Methylene Blue (CI 52015). Dyes disclosed in JP KOKAI No. Sho 62-293247 are particularly preferable. Those dyes may be contained in an amount of 0.01 to 10% by weight, preferably 0.1 to 3% by weight, with respect to the total solid content of the image recording layer.

—Plasticizer—

The heat-sensitive layer of the PS plate for use in the present invention may further comprise a plasticizer, if necessary, to impart the flexibility and other properties to the image recording layer. Examples of the plasticizer include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

—Wax—

The image recording layer of the PS plate for use in the present invention may further comprise a compound for decreasing the coefficient of static friction of the surface so as to improve the scratch resistance. More specifically, compounds having a long-chain alkylcarboxylic ester as described in U.S. Pat. No. 6,117,913 and JP KOKAI Nos. 2003-149799, 2003-302750 and 2004-12770 can be used as the wax.

Such a wax may be contained in an amount of 0.1 to 10% by weight, preferably 0.5 to 5% by weight, with respect to the total weight of the heat-sensitive layer.

The above-mentioned components are dissolved in a solvent to prepare a coating liquid for heat-sensitive layer, and then the coating liquid is applied to a suitable substrate so as to make a PS plate.

[Solvent Used for Coating Liquid for Heat-Sensitive Layer]

Examples of the solvent used to prepare the coating liquids for the heat-sensitive layer include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, and water. The solvents for use in the present invention are not limited to the above-mentioned examples. Those solvents may be used alone or in combination.

When the image recording layer consists of an upper recording layer and a lower recording layer and these layers are provided adjacently, in selecting the solvents for preparation of the coating liquids, it is desirably considered that a solvent for coating the upper recording layer be selected substantially not to dissolve the lower recording layer in order to avoid the miscibility at the interface between the two layers. The concentration of the entire solid content of the components including the additives in the solvent may be preferably in the range of 1 to 50% by weight.

When an acid anhydride is used, the coating liquid has preferably water content of not more than 0.5% by weight.

[Amount of Coating]

The coating liquid for formation of the image recording layer may preferably be applied to the substrate for use in the PS plate with a deposition amount (solid amount) ranging from 0.3 to 3.0 g/m$^2$ from the aspect of the film properties and the printing durability. The amount is preferably from 0.5 to 2.5 g/m$^2$, and more preferably from 0.8 to 1.6 g/m$^2$.

[Layered Structure]

The PS plate used for the present invention is the one wherein the image recording layer comprising the above-mentioned components is provided on a substrate, and the image recording layer may have a layered structure consisting of at least two layers. Hereinafter, a case wherein the image recording layer consists of two layers of upper layer and lower layer is explained.

In this case, the alkali-soluble resin contained in the upper layer and the lower layer may be the one which is described above, and the alkali-soluble resin used in the upper layer is preferably less soluble in alkali than one used in the lower layer.

The IR-absorbing dye used in the each layer may be the same or different, and two or more IR-absorbing dyes may be used in the respective layer. The amount of the IR-absorbing dye in any one of the both layers is, as described above, from 0.01 to 50% by weight with respect to the total solid content of the layer to which the dye is added, preferably from 0.1 to 50% by weight, and more preferably from 0.1 to 30% by weight. In case that the IR-absorbing dye is added to the both layers, it is desirable that the total amount of the IR-absorbing dye is in the above range.

As to the materials which can be pyrolytically decomposed and can substantially decrease the solubility of the alkali-soluble polymer in the alkaline developing solution before pyrolytical decomposition, it is effective to involve this material in the lower layer, when the image recording layer has a layered structure, since this material may decompose partially with time. However, any of the upper layer and the lower layer may comprise this material, or the both layers may comprise this material. The amount of this material is as described above. When this material is incorporated into plural layers, the total of the amount thereof is preferably within the above range.

It is effective to use the lactone compound in the upper layer when the image recording layer has a layered structure. However, any of the upper layer and the lower layer, or the both layers may comprise the lactone compound.

[Substrate]

In the PS plate for lithographic printing for use in the present invention, any dimensionally stable plate-shaped materials with a required strength and durability can be used as the hydrophilic substrate. Preferably used are a sheet of paper; a laminated sheet prepared by covering paper with a thin layer of plastic, such as polyethylene, polypropylene or polystyrene; a metal plate made of, for example, aluminum, zinc or copper; a plastic film made of, for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal; and a sheet of paper or plastic film to which the above-mentioned metals are attached or deposited.

A polyester film and an aluminum plate are particularly preferable as the substrate for the PS plate in the present invention. In particular, the aluminum plate is most preferable because the dimensional stability is excellent and the cost is relatively low.

Aluminum plates substantially composed of pure aluminum or an aluminum alloy containing a trace amount of elements other than aluminum are suitable. In addition, plastic sheets to which the aluminum plate is attached or the aluminum is deposited are also preferable. Examples of the above-mentioned elements used in the aluminum alloys are silicon, iron, manganese, copper, magnesium, chromium, zinc, bismuth, nickel and titanium. The content of such elements for use in the aluminum alloy is at most 10% by weight.

Although the pure aluminum plates are particularly preferable for the substrate, production of perfectly pure aluminum is difficult from the viewpoint of the refining technique, so that a trace amount of different elements may be contained. In such a way, the composition of the aluminum plate is not particularly limited, and conventional aluminum plates may be appropriately used for the substrate of the PS plate in the present invention. The thickness of the aluminum plate serving as the substrate is within the range from about 0.1 to about 0.6 mm, preferably 0.15 to 0.4 mm, and more preferably 0.2 to 0.3 mm.

The aluminum plate may be first subjected to degreasing, if required, prior to the surface roughening treatment, using a surfactant, an organic solvent, or an aqueous alkaline solution to remove rolling oil from the surface of the aluminum plate.

To provide the aluminum plate with a grained surface, there can be used various methods, for example, a method of mechanically roughening the surface of the aluminum plate, a method of electrochemically dissolving the surface of the aluminum plate, and a method of chemically dissolving the selected portions of the aluminum plate surface. The mechanical graining includes conventional processes, such as ball graining, brush graining, blast graining, and buffing graining. The electrochemical graining can be carried out in an electrolytic solution such as a hydrochloric acid or nitric acid solution by the application of a direct current or alternating current. Moreover, the above-mentioned mechanical graining and electrochemical graining may be used in combination as disclosed in JP KOKAI No. Sho 54-63902.

The surface-grained aluminum plate thus obtained may be subjected to alkali etching, followed by neutralization. After that, an anodized film may usually be provided on the aluminum plate by anodization to improve the water retention properties and wear resistance.

Any material can be used as an electrolyte in the anodization of the aluminum plate so long as a porous anodized film can be formed on the surface of the aluminum plate. Typically, sulfuric acid, phosphoric acid, oxalic acid, chromic acid, and mixtures thereof are used as the electrolyte. The concentration of the electrolyte is appropriately determined depending upon the kind of electrolyte.

The operating conditions for the anodization cannot be particularly specified because they depend on the type of electrolyte. In general, it is proper that the concentration of the electrolyte be in the range of 1 to 80% by weight, the liquid temperature be controlled to 5 to 70° C., the current density be in the range of 5 to 60 A/dm$^2$, the applied voltage be in the range of 1 to 100 V, and the time for electrolysis be in the range of 10 seconds to 5 minutes. The deposition amount of the anodized film is suitably 1.0 g/m$^2$ or more, in the light of the sufficient printing durability, and prevention of toning by scratches on non-image areas.

After completion of the anodization, the surface of the aluminum plate may be made hydrophilic, if required. To make the aluminum surface hydrophilic, there can be employed an alkali metal silicate treatment (for example, using an aqueous solution of sodium silicate) as disclosed in U.S. Pat. Nos. 2,714,066, 3,181,461, 3,280,734 and 3,902,734. In such a silicate treatment, the aluminum substrate is immersed in an aqueous solution of sodium silicate or subjected to electrolysis therein. In addition to the silicate treatment, there can be employed other treatments using potassium fluorozirconate disclosed in JP KOKOKU No. Sho 36-22063 and polyvinylphosphonic acid disclosed in U.S. Pat. Nos. 3,276,868, 4,153,461, and 4,689,272.

The PS plate for lithographic printing for use in the present invention comprises a substrate and an image recording layer formed thereon. When necessary, the PS plate may further comprise an undercoating layer which is interposed between the substrate and the image recording layer.

A variety of organic compounds can be used for formation of the undercoating layer. Examples of such organic compounds include carboxymethyl cellulose; dextrin; gum arabic; organic phosphonic acids such as amino group-containing phosphonic acid (e.g., 2-aminoethyl phosphonic acid), phenylphosphonic acid which may have a substituent, naphthylphosphonic acid, alkylphosphonic acid, glycerophosphonic acid, methylenediphosphonic acid, and ethylenediphosphonic acid; organic phosphoric acids such as phenylphosphoric acid which may have a substituent, naphthylphosphoric acid, alkylphosphoric acid, and glycerophosphoric acid; organic phosphinic acids such as phenylphosphinic acid which may have a substituent, naphthylphosphinic acid, alkylphosphinic acid and glycerophosphinic acid; amino acids such as glycine and β-alanine; and hydrochlorides of hydroxyl group-containing amine, such as hydrochloride of triethanolamine. Those compounds may be used in combination.

An organic undercoating layer comprising at least one organic polymeric compound, which comprises repeating units represented by the following general formula may preferably be used as the foregoing undercoating layer:

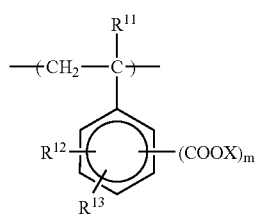

In the above formula, the substituent $R^{11}$ represents a hydrogen atom, a halogen atom or an alkyl group, the substituents $R^{12}$ and $R^{13}$ independently represent a hydrogen atom, a halogen atom, a hydroxyl group, an alkyl group, a substituted alkyl group, an aryl group, a substituted aryl group, —$OR^{14}$, —$COOR^{15}$, —$CONHR^{16}$, —$COR^{17}$ or —CN, the foregoing substituents $R^{12}$ and $R^{13}$ may be bonded together to form a ring structure. In this respect, the substituents $R^{14}$ to $R^{17}$ independently represent an alkyl group or an aryl group. X represents a hydrogen atom, a metal atom or —$NR^{18}R^{19}R^2OR^{21}$, wherein the foregoing substituents $R^{18}$ to $R^{21}$ independently represent a hydrogen atom, an alkyl group, a substituted alkyl group, an aryl group or a substituted aryl group, provided that $R^{18}$ and $R^{19}$ may be bonded together to form a ring structure, m is an integer ranging from 1 to 3.

The organic undercoating layer can be provided by the following methods. The above-mentioned organic compound is dissolved in water or organic solvents such as methanol, ethanol, and methyl ethyl ketone, or a mixture of such solvents to prepare a coating liquid for forming the undercoating layer. The coating liquid thus prepared is coated on the aluminum plate and then dried, so that an undercoating layer can be provided on the aluminum substrate. Alternatively, an aluminum plate is immersed in the solution prepared by dissolving the above-mentioned organic compound in water or organic solvents such as methanol, ethanol, and methyl ethyl ketone, or a mixture of such solvents to cause the aluminum plate to absorb the compound. Thereafter, the coated surface is washed with water and dried, thereby obtaining an organic undercoating layer on the aluminum substrate. In the former method for providing the undercoating layer, the coating liquid containing the above-mentioned organic compound at concentrations ranging from 0.005 to 10% by weight can be applied to a variety of coating methods. In the latter method, the concentration of the organic compound in the coating liquid is preferably in the range of 0.01 to 20% by weight, more preferably in the range of 0.05 to 5% by weight. The aluminum plate may be immersed in the solution of 20 to 90° C., preferably 25 to 50° C., for 0.1 sec to 20 min, preferably 2 sec to 1 min. The coating liquid used to form the undercoating layer may be controlled to pH 1 to 12 by the addition of basic materials such as ammonia, triethylamine, potassium hydroxide and the like, or acidic materials such as hydrochloric acid, phosphoric acid and the like.

It is proper that the deposition amount of the undercoating layer be in the range of 2 to 200 mg/m² from the aspect of sufficient printing durability, and preferably in the range of 5 to 100 mg/m².

The heat-sensitive PS plate for lithographic printing thus fabricated is imagewise exposed to light and thereafter subjected to development using the previously mentioned alkaline developing solution.

The light source capable of emitting the active light for achieving the light exposure includes, for example, mercury lamp, metal halide lamp, xenon lamp, chemical lamp, and carbon arc lamp. The radiation includes electron beam, X-ray, ion beam, and far infrared ray, and the like. Further, g-line, i-line, deep-UV and high-density energy beam (laser beam) are also used. The laser beam includes helium-neon laser, argon laser, krypton laser, helium-cadmium laser, KrF excimer laser, and the like. In the present invention, the light sources for emitting the light of wavelengths within the range from the near infrared to infrared region are preferred. In particular, solid laser and semiconductor laser are preferable in the present invention.

After completion of the development, the PS plate is subjected to water washing and/or rinsing and/or gumming up. In the case where the resultant PS plate bears an image portion that needs deleting, the unnecessary image portion may be deleted by, for example, applying a correction fluid as described in JP KOKOKU No. Hei 2-13293 to the unnecessary image portion and washing the portion with water after a predetermined period of time. Although the above-mentioned method is preferable, another method as described in JP KOKAI No. Sho 59-174842 can also be employed, by which method the active light guided along an optical fiber is applied to the unnecessary image portion, followed by development.

The lithographic printing plate can thus be prepared according to the method of the present invention. A desensitizing gum may be coated on the printing plate, if necessary, before printing operation. When the printing plate is required to have higher printing durability, the printing plate may be subjected to a burning treatment. In this case, it is desirable to treat the printing plate with a liquid for counteretching as described in JP KOKOKU Nos. Sho 61-2518 and 55-28062, and JP KOKAI Nos. Sho 62-31859 and 61-159655 prior to the burning treatment.

For the treatment of the printing plate with a counter-etch solution, the counter-etch solution may be coated on the printing plate using a sponge or absorbent cotton dampened with the counter-etch solution, or the printing plate may be immersed in the counter-etch solution held in a vat. Further, an automatic coater may be used. After completion of the coating, the coating amount may be made uniform by using a squeegee or squeezing roller to produce more favorable results.

It is proper that the counter-etch solution be coated on the printing plate in a coating amount of 0.03 to 0.8 g/m² on a dry basis. The printing plate thus coated with the counter-etch solution is dried, and thereafter heated to high temperatures in a burning processor such as a commercially available burning processor "BP-1300" made by Fuji Photo Film Co., Ltd., if necessary. In this case, the heating temperature and the heating time, which vary depending upon the kinds of components constituting the image portion of the printing plate, may preferably be controlled within the range of 180 to 300° C. and 1 to 20 minutes, respectively.

After the burning treatment, the printing plate may appropriately be subjected to the conventional treatments such as water washing, gumming up and the like. When the printing plate has been treated with a counter-etch solution comprising a water-soluble polymer compound, the step of desensitization including gumming up may be omitted. The lithographic printing plate thus obtained can be set in an offset press to produce large numbers of printed matters.

Other features of this invention will become apparent in the course of the following description of exemplary embodiments, which are given for illustration of the invention and are not intended to be limiting thereof.

EXAMPLES

The present invention will hereinafter be explained in more detail with reference to the following non-limitative working Examples.

<Preparation of Developing Solution>

[Preparation of $SiO_2$-containing Alkaline Developing Solution]

$SiO_2$-containing alkaline developing solutions were prepared as follows. Diverse compounds A~H and a~v and shown below, each was added at various concentrations summarized in the following Table 1 to one liter of an aqueous solution comprising 4.0% by weight of potassium silicate whose molar ratio of $SiO_2/K_2O$ was 1.1 to obtain developing solutions (1) to (30). For comparison, either of the branched-type alkyleneoxide adduct and the linear-type alkyleneoxide adduct was added to the above aqueous solution to prepare developing solutions (61) and (62), respectively. Further, the above aqueous solution comprising 4.0% by weight of potassium salt whose molar ratio of $SiO_2/K_2O$ was 1.1 was referred to as developing solution (63).

[Preparation of Nonreducing sugar containing Alkaline Developing Solution]

Nonreducing sugar-containing alkaline developing solutions were prepared as follows. Diverse compounds A~H and a~v shown below, each was added at various concentrations summarized in the following Table 2 to one liter of an aqueous solution comprising 5.0% by weight of potassium salt consisting of a combination of a nonreducing sugar and a base: D-sorbitol/potassium oxide $K_2O$ to obtain developing solutions (31) to (60). For comparison, either of the branched-type alkyleneoxide adduct and the linear-type alkyleneoxide adduct was added to the above aqueous solution to prepare developing solutions (64) and (65), respectively. Further, the above aqueous solution comprising 5.0% by weight of potassium salt consisting of a combination of a nonreducing sugar and a base: D-sorbitol/potassium oxide $K_2O$ was referred to as developing solution (66).

Branched-type alkyleneoxide adducts A to H and

Linear-type alkyleneoxide adducts a to v

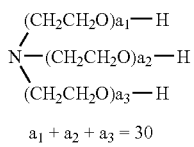

A.

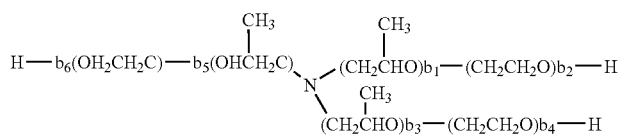

B.

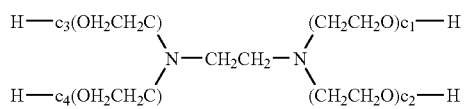

C.

-continued
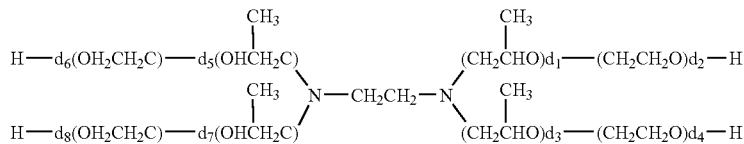
D.
$d_1 + d_2 + d_3 + d_4 + d_5 + d_6 + d_7 + d_8 = 40$
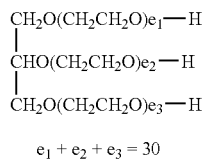
E.
$e_1 + e_2 + e_3 = 30$
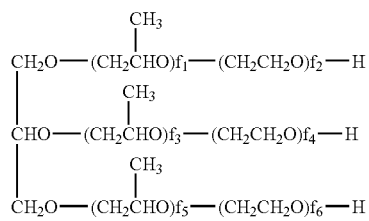
F.
$f_1 + f_2 + f_3 + f_4 + f_5 + f_6 = 30$
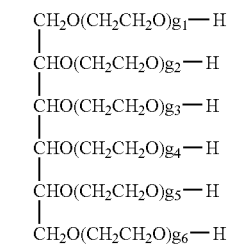
G.
$g_1 + g_2 + g_3 + g_4 + g_5 + g_6 = 60$
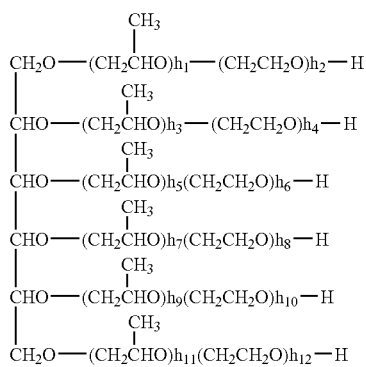
H.
$h_1 + h_2 + h_3 + h_4 + h_5 + h_6 + h_7 + h_8 + h_9 + h_{10} + h_{11} + h_{12} = 60$
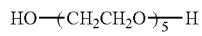
a.
b.
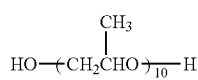
c.
d.
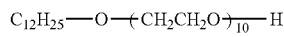
e.
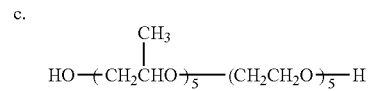
f.
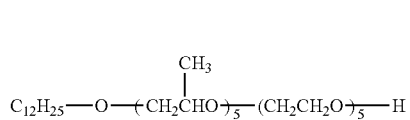
g.
h.
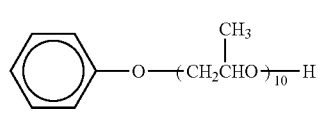
i.
j.
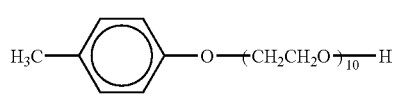
k.
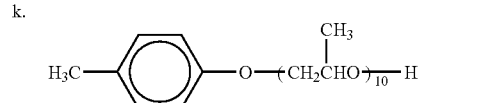
l.
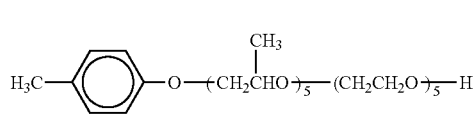
m.
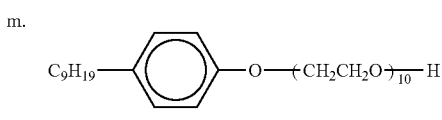
n.

-continued

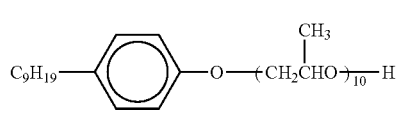  o.

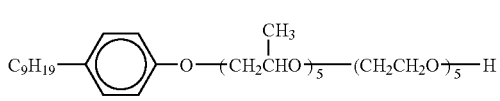  p.

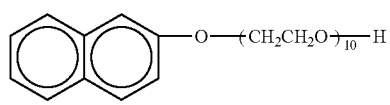  q.

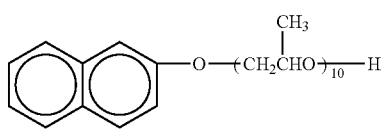  r.

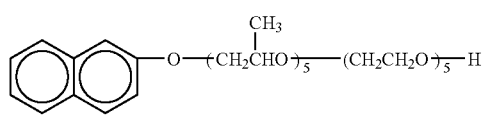  s.

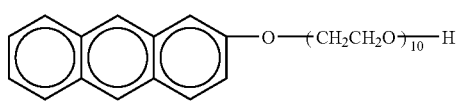  t.

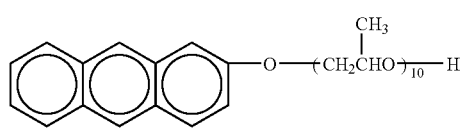  u.

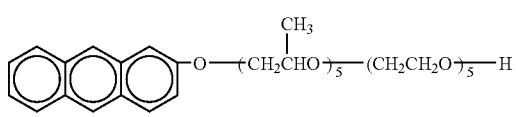  v.

TABLE 1

| SiO$_2$-containing Developing Solution No. | Compounds A to H | Concentration (g/liter) | Compounds a to v | Concentration (g/liter) |
|---|---|---|---|---|
| (1) | A | 1.5 | k | 0.5 |
| (2) | B | 1.5 | k | 0.5 |
| (3) | C | 1.5 | a | 0.5 |
| (4) | C | 1.5 | b | 0.5 |
| (5) | C | 1.5 | c | 0.5 |
| (6) | C | 1.5 | d | 0.5 |
| (7) | C | 1.5 | e | 0.5 |
| (8) | C | 1.5 | f | 0.5 |
| (9) | C | 1.5 | g | 0.5 |
| (10) | C | 1.5 | h | 0.5 |
| (11) | C | 1.5 | i | 0.5 |
| (12) | C | 1.5 | j | 0.5 |
| (13) | C | 1.5 | k | 0.5 |
| (14) | C | 1.5 | l | 0.5 |
| (15) | C | 1.5 | m | 0.5 |
| (16) | C | 1.5 | n | 0.5 |
| (17) | C | 1.5 | o | 0.5 |
| (18) | C | 1.5 | p | 0.5 |
| (19) | C | 1.5 | q | 0.5 |
| (20) | C | 1.5 | r | 0.5 |
| (21) | C | 1.5 | s | 0.5 |
| (22) | C | 1.5 | t | 0.5 |
| (23) | C | 1.5 | u | 0.5 |
| (24) | C | 1.5 | v | 0.5 |
| (25) | D | 1.5 | e | 0.5 |
| (26) | D | 1.5 | h | 0.5 |
| (27) | E | 1.5 | k | 0.5 |
| (28) | F | 1.5 | k | 0.5 |
| (29) | G | 1.5 | k | 0.5 |
| (30) | H | 1.5 | k | 0.5 |
| (61) | G | 1.5 | — | — |
| (62) | — | — | k | 0.5 |
| (63) | — | — | — | — |

TABLE 2

| Nonreducing sugar-containing Developing Solution No. | Compounds A to H | Concentration (g/liter) | Compounds a to v | Concentration (g/liter) |
|---|---|---|---|---|
| (31) | A | 1.5 | k | 0.5 |
| (32) | B | 1.5 | k | 0.5 |
| (33) | C | 1.5 | a | 0.5 |
| (34) | C | 1.5 | b | 0.5 |
| (35) | C | 1.5 | c | 0.5 |
| (36) | C | 1.5 | d | 0.5 |
| (37) | C | 1.5 | e | 0.5 |
| (38) | C | 1.5 | f | 0.5 |
| (39) | C | 1.5 | g | 0.5 |
| (40) | C | 1.5 | h | 0.5 |
| (41) | C | 1.5 | i | 0.5 |
| (42) | C | 1.5 | j | 0.5 |
| (43) | C | 1.5 | k | 0.5 |
| (44) | C | 1.5 | l | 0.5 |
| (45) | C | 1.5 | m | 0.5 |
| (46) | C | 1.5 | n | 0.5 |
| (47) | C | 1.5 | o | 0.5 |
| (48) | C | 1.5 | p | 0.5 |
| (49) | C | 1.5 | q | 0.5 |
| (50) | C | 1.5 | r | 0.5 |
| (51) | C | 1.5 | s | 0.5 |
| (52) | C | 1.5 | t | 0.5 |
| (53) | C | 1.5 | u | 0.5 |
| (54) | C | 1.5 | v | 0.5 |
| (55) | D | 1.5 | e | 0.5 |
| (56) | D | 1.5 | h | 0.5 |
| (57) | E | 1.5 | k | 0.5 |
| (58) | F | 1.5 | k | 0.5 |
| (59) | G | 1.5 | k | 0.5 |
| (60) | H | 1.5 | k | 0.5 |
| (64) | G | 1.5 | — | — |
| (65) | — | — | k | 0.5 |
| (66) | — | — | — | — |

Examples 1 to 60 and Comparative Examples 1 to 6

PS plates (IR-presensitized plates) to be processed in Examples 1 to 60 and Comparative Examples 1 to 6 were prepared by the following procedure. Then, Developing Solutions (1) to (60) were used in development in Examples 1 to 60, respectively, and Developing Solutions (61) to (66) were used in development in Comparative Examples 1 to 6, respectively.

<Preparation of PS Plate (1)>

An aluminum plate of 0.3 mm thick (grade 1050) was washed with trichloroethylene to be degreased, and surface-grained with a nylon brush and an aqueous suspension of 400 mesh pumice stone, and then sufficiently washed with water. The aluminum plate was then subjected to an immersed-electrolytic etching in a 25% aqueous solution of sodium hydroxide at 45° C. for 9 seconds, washed with water, and further immersed in a 20% aqueous solution of nitric acid for 20 seconds, and washed with water. The etching amount of grained surface was about 3 g/m². Then it was anodized in a 7% aqueous solution of sulfuric acid at a DC current density of 15 A/dm² so that the thickness of the resulting anodized layer was 3 g/m², washed with water, and then dried. Thereafter, the aluminum plate was treated with a 2.5% aqueous solution of sodium silicate at 30° C. for 10 seconds, coated with the following coating solution of undercoating layer, and dried under 80° C. for 15 seconds to obtain a substrate. The coated amount of the undercoating layer after drying was 15 mg/m².

| <Coating Solution of Undercoating Layer> | |
|---|---|
| Copolymer P (molecular weight: 28,000) represented by the formula below | 0.3 g |
| Methanol | 100 g |
| Water | 1 g |

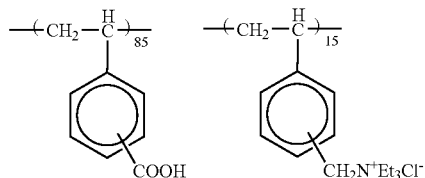

Copolymer P

Synthesis Example 1

(Synthesis of Alkali-Soluble High Molecular Weight Compound (Copolymer) having Carboxyl Group)

To a 20 ml volume three-necked flask equipped with a stirring machine, a cooling tube and a dropping funnel, there were added 6.39 g (0.045 mole) of n-propyl methacrylate, 1.29 g (0.015 mole) of methacrylic acid and 20 g of 1-methoxy-2-propanol and then the resulting mixture was stirred while heating it at 65□ in a hot water bath. To this mixture, there was added 0.15 g of "V-601" (available from WAKO Pure Chemical Co., Ltd.) and then the mixture was stirred in a nitrogen gas stream for 2 hours while retaining the same at 70° C. To this reaction mixture, there was further dropwise added a mixture comprising 6.39 g (0.045 mole) of n-propyl methacrylate, 1.29 g (0.015 mole) of methacrylic acid, 20 g of 1-methoxy-2-propanol and 0.15 of "V-601" through a dropping funnel over 2 hours. After the dropwise addition of the mixture, the resulting mixture was additionally stirred at 90° C. for 2 hours. After the completion of the reaction, 40 g of methanol was added to the reaction mixture, followed by cooling the mixture, introduction of the resulting mixture into 2 L of water while stirring the water, stirring the mixture over 30 minutes, filtration of the reaction mixture to remove precipitates thus formed, and then drying the precipitates to give 15 g of a white solid. The weight-average molecular weight (polystyrene standard) of the copolymer was determined by the gel permeation chromatography and it was found to be 53,000.

Synthesis Example 2

(Synthesis of Alkali-Soluble High Molecular Weight Compound (Copolymer) having Carboxyl Group)

According to the same procedure as in Synthesis Example 1, ethyl methacrylate/isobutyl methacrylate/methacrylic acid (mole %: 35/35/30) were used to synthesize a copolymer. The weight-average molecular weight (polystyrene standard) of the copolymer was determined by the gel permeation chromatography and it was found to be 50,000.

Synthesis Example 3

(Synthesis of Polyurethane Resin having Carboxyl Group)

To a 500 ml volume three-necked round-bottom flask equipped with a cooler, there were added 14.6 g (0.109 mole) of 2,2-bis(hydroxymethyl)propionic acid, 13.3 g (0.0686 mole) of tetraethylene glycol and 2.05 g (0.0228 mole) of 1,4-butane diol, and then the mixture was dissolved in 118 g of N,N-dimethylacetamide. To this mixture, 30.8 g (0.123 mole) of 4,4'-diphenylmethane diisocyanate, 13.8 g (0.0819 mole) of hexamethylene diisocyanate and 0.1 of dilauric acid di-n-butyl tin as a catalyst were added, and then the resulting mixture was heated at 90° C. for 7 hours while stirring it.

To the reaction liquid, there were added 100 ml of N,N-dimethylacetamide, 50 ml of methanol and 50 ml of acetic acid, and then the mixture was stirred, and said mixture was charged into 4 liter of water with stirring to precipitate a white polymer. This polymer was separated, washed with water, and then dried under reduced pressure to give 60 g of the polymer.

The weight-average molecular weight (polystyrene standard) of the polymer was determined by the gel permeation chromatography and it was found to be 70,000. The content of carboxyl groups in the polymer was determined by titration and it was found to be 1.43 meq/g.

Synthesis Example 4

(Synthesis of Polyurethane Resin having Carboxyl Group)

According to the same procedure as in Synthesis Example 3, the following diisocyanate compounds (mole %):

(70)

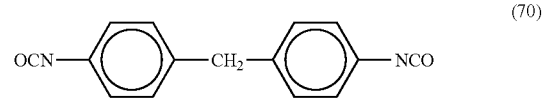

and the following diol compounds (mole %):

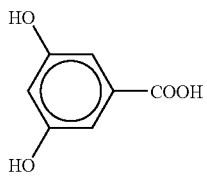

(60)

were used to synthesize a copolymer. The content of acids in the polymer was found to be 1.72 meq/g, and the weight-average molecular weight (polystyrene standard) of the copolymer was found to be 80,000.

Synthesis Example 5

To a 500 ml volume three-necked flask equipped with a stirring machine, a cooling tube and a dropping funnel, there were added 31.0 g (0.36 mole) of methacrylic acid, 39.1 g (0.36 mole) of ethyl chloroformate and 200 ml of acetonitrile and then the resulting mixture was stirred while cooling it in an ice-water bath. To this mixture, there was dropwise added 36.4 g (0.36 mole) of triethylamine through the dropping funnel over about one hour. After the completion of the dropwise addition, the ice-water bath was removed and the mixture was stirred at room temperature for 30 minutes. To this reaction mixture, there was added 51.7 g (0.30 mole) of p-aminobenzene sulfonamide and the resulting mixture was stirred over one hour while warming the mixture at 70° C. in an oil bath. After the completion of the reaction, the mixture was introduced into 1 L of water while stirring the water and the resulting mixture was stirred for 30 minutes. This mixture was filtered to recover the precipitates, followed by addition of 500 ml of water to the precipitates to give a slurry, filtration of the slurry and drying the resulting solid to give N-(p-aminosulfonylphenyl) methacrylamide as a white solid (yield 46.9 g).

Then there were added 4.61 g (0.0192 mole) of N-(p-aminosulfonylphenyl) methacrylamide, 2.94 g (0.0258 mole) of ethyl methacrylate, 0.80 g (0.015 mole) of acrylonitrile and 20 g of N,N-dimethyl acetamide to a 20 ml volume three-necked flask equipped with a stirring machine, a cooling tube and a dropping funnel, followed by stirring the resulting mixture while heating it to 65° C. in a hot water bath. To this mixture, there was added 0.15 g of "V-65" (available from WAKO Pure Chemical Co., Ltd.) and then the mixture was stirred in a nitrogen gas stream for 2 hours while retaining the same at 65° C. To this reaction mixture, there was further dropwise added a mixture comprising 4.61 g of N-(p-aminosulfonylphenyl) methacrylamide, 2.94 g of ethyl methacrylate, 0.80 g of acrylonitrile, N,N-dimethyl acetamide and 0.15 g of "V-65" through the dropping funnel over 2 hours. After the dropwise addition of the mixture, the resulting mixture was additionally stirred at 65° C. for 2 hours. After the completion of the reaction, 40 g of methanol was added to the reaction mixture, followed by cooling the mixture, introduction of the resulting mixture into 2 L of water while stirring the water, stirring the mixture over 30 minutes, filtration of the reaction mixture to remove precipitates thus formed and then drying the precipitates to give 15 g of a white solid. The weight-average molecular weight (polystyrene standard) of the specific copolymer was determined by the gel permeation chromatography and it was found to be 53,000.

The following coating solution of image recording layer was applied onto the surface of the aluminum substrate obtained above and dried under 150° C. for 30 seconds in an amount of 1.8 g/m² (weighed after drying) to obtain a positive-working PS plate.

| <Coating solution of Image recording Layer> | |
|---|---|
| Copolymer of Synthesis Example 2 | 0.050 g |
| Copolymer of Synthesis Example 4 | 0.050 g |
| Copolymer of Synthesis Example 5 | 0.4 g |
| M,p-cresol novolac (m/p ratio = 6/4, weight-average molecular weight of 8,000, comprising 0.5% by weight of unreacted cresol) | 0.6 g |
| Cyanine dye A | 0.1 g |
| Phthalic anhydride | 0.05 g |
| P-toluene sulfonic acid | 0.002 g |
| Ethylviolet (counter ion: 6-hydroxy-β-naphthalene sulfonic acid) | 0.02 g |
| Esterified product of 1,2-diazonaphthoquinone-5-sulfonyl chloride and pyrogallol/acetone resin | 0.01 g |
| Fluorine atom-containing surfactant (trade name of Megaface F-177 manufactured by Dainippon Ink and Chemicals, Inc.) | 0.05 g |
| Methyl ethyl ketone | 8 g |
| 1-Methoxy-2-propanol | 4 g |

The above obtained PS plate was light-exposed using a semiconductor laser with an output power of 500 mW, a wave length of 830 nm and a beam diameter of 17 μm(1/e²) at a horizontal scanning speed of 5 m/sec, and maintained at 25° C.

The PS plate thus treated was processed by an automatic processor, PS900NP (manufactured by Fuji Photo Film Co., Ltd.) filled up with the above each developing solution, at a development temperature of 30° C. for 12 seconds. The plate was processed in the above processor at throughput of 50, 100, 200, 300, 400 and 500 m² without supplement of replenisher. After the development procedure, the plate was washed with water and treated with a gum solution (two-fold dilution of GU-7 manufactured by Fuji Photo Film Co., Ltd.) so as to obtain a lithographic printing plate.

<Evaluation on Balance of Image Area/Non-image Area>

[Evaluation on Development of Non-image Area]

Development effect on the non-image areas of the above lithographic printing plate obtained at immediately after the start of processing, and at the time of throughput of 50, 100, 200, 300, 400 and 500 m² plate was visually determined by observing undissolved residue on non-image areas. In addition, toning on a printed matter was also evaluated. The results were shown in Tables 3 and 4.

Criteria:
○: The non-image areas were sufficiently developed and there was observed no residue of the image recording layer on the non-image areas. Toning on the printed matter was not observed.

Δ: The image recording layer was left slightly on the non-image areas. Toning on the printed matter was not observed.

X: Failure of development was observed, and the image recording layer was left on the non-image areas. Toning on the printed matter was observed.

[Evaluation of Impairment of Image Area]

Impairment of the image areas of the above lithographic printing plate obtained at immediately after the start of processing, and at the time of throughput of 50, 100, 200, 300, 400 and 500 m² plate was visually determined. The results were shown in Tables 5 and 6.

Criteria:

○: There was observed no impairment in the image areas. Color defect of the image areas on the printed matter was not observed.

Δ: Image density was slightly decreased, and the impairment of the image areas was partially observed. Color defect of the image areas on the printed matter was not observed.

X: Image density was largely decreased, and the impairment of the image areas was partially observed. Color defect of the image areas on the printed matter was observed.

TABLE 3

| Example No. | SiO$_2$-containing Developing Solution No. | Development of Non-Image Area | | | | | | |
|---|---|---|---|---|---|---|---|---|
| | | Immediately after start | \multicolumn{7}{c}{Throughput (m²)} |
| | | | 50 | 100 | 200 | 300 | 400 | 500 |
| 1 | (1) | ○ | ○ | ○ | ○ | ○ | ○ | ○ |
| 2 | (2) | ○ | ○ | ○ | ○ | ○ | ○ | ○ |
| 3 | (3) | ○ | ○ | ○ | ○ | ○ | ○ | ○ |
| 4 | (4) | ○ | ○ | ○ | ○ | ○ | ○ | ○ |
| 5 | (5) | ○ | ○ | ○ | ○ | ○ | ○ | ○ |
| 6 | (6) | ○ | ○ | ○ | ○ | ○ | ○ | ○ |
| 7 | (7) | ○ | ○ | ○ | ○ | ○ | ○ | ○ |
| 8 | (8) | ○ | ○ | ○ | ○ | ○ | ○ | ○ |
| 9 | (9) | ○ | ○ | ○ | ○ | ○ | ○ | ○ |
| 10 | (10) | ○ | ○ | ○ | ○ | ○ | ○ | ○ |
| 11 | (11) | ○ | ○ | ○ | ○ | ○ | ○ | ○ |
| 12 | (12) | ○ | ○ | ○ | ○ | ○ | ○ | ○ |
| 13 | (13) | ○ | ○ | ○ | ○ | ○ | ○ | ○ |
| 14 | (14) | ○ | ○ | ○ | ○ | ○ | ○ | ○ |
| 15 | (15) | ○ | ○ | ○ | ○ | ○ | ○ | ○ |
| 16 | (16) | ○ | ○ | ○ | ○ | ○ | ○ | ○ |
| 17 | (17) | ○ | ○ | ○ | ○ | ○ | ○ | ○ |
| 18 | (18) | ○ | ○ | ○ | ○ | ○ | ○ | ○ |
| 19 | (19) | ○ | ○ | ○ | ○ | ○ | ○ | ○ |
| 20 | (20) | ○ | ○ | ○ | ○ | ○ | ○ | ○ |
| 21 | (21) | ○ | ○ | ○ | ○ | ○ | ○ | ○ |
| 22 | (22) | ○ | ○ | ○ | ○ | ○ | ○ | ○ |
| 23 | (23) | ○ | ○ | ○ | ○ | ○ | ○ | ○ |
| 24 | (24) | ○ | ○ | ○ | ○ | ○ | ○ | ○ |
| 25 | (25) | ○ | ○ | ○ | ○ | ○ | ○ | ○ |
| 26 | (26) | ○ | ○ | ○ | ○ | ○ | ○ | ○ |
| 27 | (27) | ○ | ○ | ○ | ○ | ○ | ○ | ○ |
| 28 | (28) | ○ | ○ | ○ | ○ | ○ | ○ | ○ |
| 29 | (29) | ○ | ○ | ○ | ○ | ○ | ○ | ○ |
| 30 | (30) | ○ | ○ | ○ | ○ | ○ | ○ | ○ |
| Comparative Ex. 1 | (61) | ○ | ○ | ○ | Δ | Δ | X | X |
| Comparative Ex. 2 | (62) | ○ | ○ | ○ | Δ | Δ | X | X |
| Comparative Ex. 3 | (63) | ○ | ○ | ○ | ○ | ○ | ○ | ○ |

TABLE 4

| Example No. | Nonreducing sugar-containing Developing Solution No. | Development of Non-Image Area | | | | | | |
|---|---|---|---|---|---|---|---|---|
| | | Immediately after start | \multicolumn{7}{c}{Throughput (m²)} |
| | | | 50 | 100 | 200 | 300 | 400 | 500 |
| 31 | (31) | ○ | ○ | ○ | ○ | ○ | ○ | ○ |
| 32 | (32) | ○ | ○ | ○ | ○ | ○ | ○ | ○ |
| 33 | (33) | ○ | ○ | ○ | ○ | ○ | ○ | ○ |
| 34 | (34) | ○ | ○ | ○ | ○ | ○ | ○ | ○ |
| 35 | (35) | ○ | ○ | ○ | ○ | ○ | ○ | ○ |
| 36 | (36) | ○ | ○ | ○ | ○ | ○ | ○ | ○ |
| 37 | (37) | ○ | ○ | ○ | ○ | ○ | ○ | ○ |
| 38 | (38) | ○ | ○ | ○ | ○ | ○ | ○ | ○ |
| 39 | (39) | ○ | ○ | ○ | ○ | ○ | ○ | ○ |
| 40 | (40) | ○ | ○ | ○ | ○ | ○ | ○ | ○ |
| 41 | (41) | ○ | ○ | ○ | ○ | ○ | ○ | ○ |
| 42 | (42) | ○ | ○ | ○ | ○ | ○ | ○ | ○ |
| 43 | (43) | ○ | ○ | ○ | ○ | ○ | ○ | ○ |
| 44 | (44) | ○ | ○ | ○ | ○ | ○ | ○ | ○ |
| 45 | (45) | ○ | ○ | ○ | ○ | ○ | ○ | ○ |

TABLE 4-continued

| Example No. | Nonreducing sugar-containing Developing Solution No. | Development of Non-Image Area |||||||
|---|---|---|---|---|---|---|---|---|
| | | Immediately after start | _____ Throughput (m²) _____ |||||| 
| | | | 50 | 100 | 200 | 300 | 400 | 500 |
| 46 | (46) | ○ | ○ | ○ | ○ | ○ | ○ | ○ |
| 47 | (47) | ○ | ○ | ○ | ○ | ○ | ○ | ○ |
| 48 | (48) | ○ | ○ | ○ | ○ | ○ | ○ | ○ |
| 49 | (49) | ○ | ○ | ○ | ○ | ○ | ○ | ○ |
| 50 | (50) | ○ | ○ | ○ | ○ | ○ | ○ | ○ |
| 51 | (51) | ○ | ○ | ○ | ○ | ○ | ○ | ○ |
| 52 | (52) | ○ | ○ | ○ | ○ | ○ | ○ | ○ |
| 53 | (53) | ○ | ○ | ○ | ○ | ○ | ○ | ○ |
| 54 | (54) | ○ | ○ | ○ | ○ | ○ | ○ | ○ |
| 55 | (55) | ○ | ○ | ○ | ○ | ○ | ○ | ○ |
| 56 | (56) | ○ | ○ | ○ | ○ | ○ | ○ | ○ |
| 57 | (57) | ○ | ○ | ○ | ○ | ○ | ○ | ○ |
| 58 | (58) | ○ | ○ | ○ | ○ | ○ | ○ | ○ |
| 59 | (59) | ○ | ○ | ○ | ○ | ○ | ○ | ○ |
| 60 | (60) | ○ | ○ | ○ | ○ | ○ | ○ | ○ |
| Comparative Ex. 4 | (64) | ○ | ○ | ○ | Δ | Δ | X | X |
| Comparative Ex. 5 | (65) | ○ | ○ | ○ | Δ | Δ | X | X |
| Comparative Ex. 6 | (66) | ○ | ○ | ○ | ○ | ○ | ○ | ○ |

TABLE 5

| Example No. | $SiO_2$-containing Developing Solution No. | Impairment of Image Area |||||||
|---|---|---|---|---|---|---|---|---|
| | | Immediately after start | _____ Throughput (m²) _____ ||||||
| | | | 50 | 100 | 200 | 300 | 400 | 500 |
| 1 | (1) | ○ | ○ | ○ | ○ | ○ | ○ | ○ |
| 2 | (2) | ○ | ○ | ○ | ○ | ○ | ○ | ○ |
| 3 | (3) | ○ | ○ | ○ | ○ | ○ | ○ | ○ |
| 4 | (4) | ○ | ○ | ○ | ○ | ○ | ○ | ○ |
| 5 | (5) | ○ | ○ | ○ | ○ | ○ | ○ | ○ |
| 6 | (6) | ○ | ○ | ○ | ○ | ○ | ○ | ○ |
| 7 | (7) | ○ | ○ | ○ | ○ | ○ | ○ | ○ |
| 8 | (8) | ○ | ○ | ○ | ○ | ○ | ○ | ○ |
| 9 | (9) | ○ | ○ | ○ | ○ | ○ | ○ | ○ |
| 10 | (10) | ○ | ○ | ○ | ○ | ○ | ○ | ○ |
| 11 | (11) | ○ | ○ | ○ | ○ | ○ | ○ | ○ |
| 12 | (12) | ○ | ○ | ○ | ○ | ○ | ○ | ○ |
| 13 | (13) | ○ | ○ | ○ | ○ | ○ | ○ | ○ |
| 14 | (14) | ○ | ○ | ○ | ○ | ○ | ○ | ○ |
| 15 | (15) | ○ | ○ | ○ | ○ | ○ | ○ | ○ |
| 16 | (16) | ○ | ○ | ○ | ○ | ○ | ○ | ○ |
| 17 | (17) | ○ | ○ | ○ | ○ | ○ | ○ | ○ |
| 18 | (18) | ○ | ○ | ○ | ○ | ○ | ○ | ○ |
| 19 | (19) | ○ | ○ | ○ | ○ | ○ | ○ | ○ |
| 20 | (20) | ○ | ○ | ○ | ○ | ○ | ○ | ○ |
| 21 | (21) | ○ | ○ | ○ | ○ | ○ | ○ | ○ |
| 22 | (22) | ○ | ○ | ○ | ○ | ○ | ○ | ○ |
| 23 | (23) | ○ | ○ | ○ | ○ | ○ | ○ | ○ |
| 24 | (24) | ○ | ○ | ○ | ○ | ○ | ○ | ○ |
| 25 | (25) | ○ | ○ | ○ | ○ | ○ | ○ | ○ |
| 26 | (26) | ○ | ○ | ○ | ○ | ○ | ○ | ○ |
| 27 | (27) | ○ | ○ | ○ | ○ | ○ | ○ | ○ |
| 28 | (28) | ○ | ○ | ○ | ○ | ○ | ○ | ○ |
| 29 | (29) | ○ | ○ | ○ | ○ | ○ | ○ | ○ |
| 30 | (30) | ○ | ○ | ○ | ○ | ○ | ○ | ○ |
| Comparative Ex. 1 | (61) | ○ | ○ | Δ | Δ | X | X | X |
| Comparative Ex. 2 | (62) | ○ | ○ | Δ | Δ | X | X | X |
| Comparative Ex. 3 | (63) | X | X | X | X | X | X | X |

TABLE 6

| Example No. | Nonreducing sugar-containing Developing Solution No. | Impairment of Image Area | | | | | | |
|---|---|---|---|---|---|---|---|---|
| | | Immediately after start | \multicolumn{7}{c}{Throughput (m²)} | | | | | | |
| | | | 50 | 100 | 200 | 300 | 400 | 500 |
| 31 | (31) | ○ | ○ | ○ | ○ | ○ | ○ | ○ |
| 32 | (32) | ○ | ○ | ○ | ○ | ○ | ○ | ○ |
| 33 | (33) | ○ | ○ | ○ | ○ | ○ | ○ | ○ |
| 34 | (34) | ○ | ○ | ○ | ○ | ○ | ○ | ○ |
| 35 | (35) | ○ | ○ | ○ | ○ | ○ | ○ | ○ |
| 36 | (36) | ○ | ○ | ○ | ○ | ○ | ○ | ○ |
| 37 | (37) | ○ | ○ | ○ | ○ | ○ | ○ | ○ |
| 38 | (38) | ○ | ○ | ○ | ○ | ○ | ○ | ○ |
| 39 | (39) | ○ | ○ | ○ | ○ | ○ | ○ | ○ |
| 40 | (40) | ○ | ○ | ○ | ○ | ○ | ○ | ○ |
| 41 | (41) | ○ | ○ | ○ | ○ | ○ | ○ | ○ |
| 42 | (42) | ○ | ○ | ○ | ○ | ○ | ○ | ○ |
| 43 | (43) | ○ | ○ | ○ | ○ | ○ | ○ | ○ |
| 44 | (44) | ○ | ○ | ○ | ○ | ○ | ○ | ○ |
| 45 | (45) | ○ | ○ | ○ | ○ | ○ | ○ | ○ |
| 46 | (46) | ○ | ○ | ○ | ○ | ○ | ○ | ○ |
| 47 | (47) | ○ | ○ | ○ | ○ | ○ | ○ | ○ |
| 48 | (48) | ○ | ○ | ○ | ○ | ○ | ○ | ○ |
| 49 | (49) | ○ | ○ | ○ | ○ | ○ | ○ | ○ |
| 50 | (50) | ○ | ○ | ○ | ○ | ○ | ○ | ○ |
| 51 | (51) | ○ | ○ | ○ | ○ | ○ | ○ | ○ |
| 52 | (52) | ○ | ○ | ○ | ○ | ○ | ○ | ○ |
| 53 | (53) | ○ | ○ | ○ | ○ | ○ | ○ | ○ |
| 54 | (54) | ○ | ○ | ○ | ○ | ○ | ○ | ○ |
| 55 | (55) | ○ | ○ | ○ | ○ | ○ | ○ | ○ |
| 56 | (56) | ○ | ○ | ○ | ○ | ○ | ○ | ○ |
| 57 | (57) | ○ | ○ | ○ | ○ | ○ | ○ | ○ |
| 58 | (58) | ○ | ○ | ○ | ○ | ○ | ○ | ○ |
| 59 | (59) | ○ | ○ | ○ | ○ | ○ | ○ | ○ |
| 60 | (60) | ○ | ○ | ○ | ○ | ○ | ○ | ○ |
| Comparative Ex. 4 | (64) | ○ | ○ | Δ | Δ | X | X | X |
| Comparative Ex. 5 | (65) | ○ | ○ | Δ | Δ | X | X | X |
| Comparative Ex. 6 | (66) | X | X | X | X | X | X | X |

Examples 61 to 120 and
Comparative Examples 7 to 12

PS plates (IR-presensitized plates) to be processed in Examples 61 to 120 and Comparative Examples 7 to 12 were prepared by the following procedure. Then, Developing Solutions (1) to (60) were used in development in Examples 61 to 120, respectively, and Developing Solutions (61) to (66) were used in development in Comparative Examples 7 to 12, respectively.

<Preparation of PS Plate (2)>

On the aluminum substrate treated and provided thereon the undercoating layer as described in the above <Preparation of PS plate (1)>, the following photosensitive solution 2 was applied in amount of 0.85 g/m² (weighed after drying) through a wire bar, and dried by using Perfect Over PH200 manufactured by TABAI Co. under a wind control of 7, at a temperature of 140° C. for 50 seconds. Further, the following photosensitive solution 3 was applied thereon in amount of 0.22 g/m² (weighed after drying) through a wire bar, and then dried by using Perfect Over PH200 manufactured by TABAI Co. under wind control of 7, at a temperature of 120° C. for 60 seconds to obtain a PS plate having a heat-sensitive layer consisting in two-layered structure.

<Photosensitive Solution 2>

| | |
|---|---|
| Copolymer of Synthesis Example 2 | 0.050 g |
| Copolymer of Synthesis Example 4 | 0.050 g |
| N-(4-Aminosulfonylphenyl)methacrylamide/ acrylonitrile/methyl methacrylate (36/34/30, weight-average molecular weight of 50,000) | 1.896 g |
| Cresol novolac (m/p ratio = 6/4, weight-average molecular weight of 4,500, comprising 0.8% by weight of unreacted monomer) | 0.237 g |
| Cyanine dye A | 0.109 g |
| 4,4'-Bishydroxyphenylsulfone | 0.063 g |
| Tetrahydrophthalic anhydride | 0.190 g |
| P-toluene sulfonic acid | 0.008 g |
| Ethylviolet (counter ion: 6-hydroxy-β-naphthalene sulfonic acid) | 0.05 g |
| Fluorine atom-containing surfactant (trade name of F-176 manufactured by Dainippon Ink and Chemicals, Inc.) | 0.035 g |
| Methyl ethyl ketone | 26.6 g |
| 1-Methoxy-2-propanol | 13.6 g |
| γ-butyrolactone | 13.8 g |

<Photosensitive Solution 3>

| | |
|---|---|
| Copolymer of Synthesis Example 2 | 0.050 g |
| Copolymer of Synthesis Example 4 | 0.050 g |
| Cresol novolac (m/p ratio = 6/4, weight-average molecular weight of 4,500, comprising 0.8% by weight of unreacted monomer) | 0.237 g |

-continued

| | |
|---|---|
| Cyanine dye A | 0.047 g |
| Dodecyl stearate | 0.060 g |
| 3-Methoxy-4-diazodiphenylamine hexafluorophosphate | 0.030 g |
| Fluorine atom-containing surfactant (trade name of F-176 (20% solution) manufactured by Dainippon Ink and Chemicals, Inc.) | 0.110 g |
| Fluorine atom-containing surfactant (trade name of MCF312F (30% solution) manufactured by Dainippon Ink and Chemicals, Inc.) | 0.12 g |
| Methyl ethyl ketone | 15.1 g |
| 1-Methoxy-2-propanol | 7.7 g |

The above obtained PS plate was light-exposed using a semiconductor laser with an output power of 500 mW, a wave length of 830 nm and a beam diameter of 17 μm($1/e^2$) at a horizontal scanning speed of 5 m/sec, and maintained at 25° C.

The PS plate thus treated was processed by an automatic processor, PS900NP (manufactured by Fuji Photo Film Co., Ltd.) filled up with the above each developing solution, at a development temperature of 30° C. for 12 seconds. The plate was processed in the above processor at throughput of 50, 100, 200, 300 400 and 500 $m^2$ without supplement of replenisher. After the development procedure, the plate was washed with water and treated with a gum solution (two-fold dilution of GU-7 manufactured by Fuji Photo Film Co., Ltd.) so as to obtain a lithographic printing plate.

The lithographic printing plates thus obtained were evaluated in the same manner as described in Examples 1 to 60. The results are shown in Tables 7 and 8 for development of non-image areas, and in Tables 9 and 10 for impairment of image areas.

TABLE 7

| Example No. | SiO$_2$-containing Developing Solution No. | Development of Non-Image Area | | | | | | |
|---|---|---|---|---|---|---|---|---|
| | | Immediately after start | \multicolumn{7}{c}{Throughput ($m^2$)} |
| | | | 50 | 100 | 200 | 300 | 400 | 500 |
| 61 | (1) | ○ | ○ | ○ | ○ | ○ | ○ | ○ |
| 62 | (2) | ○ | ○ | ○ | ○ | ○ | ○ | ○ |
| 63 | (3) | ○ | ○ | ○ | ○ | ○ | ○ | ○ |
| 64 | (4) | ○ | ○ | ○ | ○ | ○ | ○ | ○ |
| 65 | (5) | ○ | ○ | ○ | ○ | ○ | ○ | ○ |
| 66 | (6) | ○ | ○ | ○ | ○ | ○ | ○ | ○ |
| 67 | (7) | ○ | ○ | ○ | ○ | ○ | ○ | ○ |
| 68 | (8) | ○ | ○ | ○ | ○ | ○ | ○ | ○ |
| 69 | (9) | ○ | ○ | ○ | ○ | ○ | ○ | ○ |
| 70 | (10) | ○ | ○ | ○ | ○ | ○ | ○ | ○ |
| 71 | (11) | ○ | ○ | ○ | ○ | ○ | ○ | ○ |
| 72 | (12) | ○ | ○ | ○ | ○ | ○ | ○ | ○ |
| 73 | (13) | ○ | ○ | ○ | ○ | ○ | ○ | ○ |
| 74 | (14) | ○ | ○ | ○ | ○ | ○ | ○ | ○ |
| 75 | (15) | ○ | ○ | ○ | ○ | ○ | ○ | ○ |
| 76 | (16) | ○ | ○ | ○ | ○ | ○ | ○ | ○ |
| 77 | (17) | ○ | ○ | ○ | ○ | ○ | ○ | ○ |
| 78 | (18) | ○ | ○ | ○ | ○ | ○ | ○ | ○ |
| 79 | (19) | ○ | ○ | ○ | ○ | ○ | ○ | ○ |
| 80 | (20) | ○ | ○ | ○ | ○ | ○ | ○ | ○ |
| 81 | (21) | ○ | ○ | ○ | ○ | ○ | ○ | ○ |
| 82 | (22) | ○ | ○ | ○ | ○ | ○ | ○ | ○ |
| 83 | (23) | ○ | ○ | ○ | ○ | ○ | ○ | ○ |
| 84 | (24) | ○ | ○ | ○ | ○ | ○ | ○ | ○ |
| 85 | (25) | ○ | ○ | ○ | ○ | ○ | ○ | ○ |
| 86 | (26) | ○ | ○ | ○ | ○ | ○ | ○ | ○ |
| 87 | (27) | ○ | ○ | ○ | ○ | ○ | ○ | ○ |
| 88 | (28) | ○ | ○ | ○ | ○ | ○ | ○ | ○ |
| 89 | (29) | ○ | ○ | ○ | ○ | ○ | ○ | ○ |
| 90 | (30) | ○ | ○ | ○ | ○ | ○ | ○ | ○ |
| Comparative Ex. 7 | (61) | ○ | ○ | ○ | ○ | ○ | Δ | Δ | Δ |
| Comparative Ex. 8 | (62) | ○ | ○ | ○ | ○ | ○ | Δ | Δ | Δ |
| Comparative Ex. 9 | (63) | ○ | ○ | ○ | ○ | ○ | ○ | ○ | ○ |

TABLE 8

| Example No. | Nonreducing sugar-containing Developing Solution No. | Development of Non-Image Area | | | | | | |
|---|---|---|---|---|---|---|---|---|
| | | Immediately after start | 50 | 100 | 200 | 300 | 400 | 500 |
| 91 | (31) | ○ | ○ | ○ | ○ | ○ | ○ | ○ |
| 92 | (32) | ○ | ○ | ○ | ○ | ○ | ○ | ○ |

TABLE 8-continued

| Example No. | Nonreducing sugar-containing Developing Solution No. | Development of Non-Image Area Immediately after start | 50 | 100 | 200 | 300 | 400 | 500 |
|---|---|---|---|---|---|---|---|---|
| 93 | (33) | ○ | ○ | ○ | ○ | ○ | ○ | ○ |
| 94 | (34) | ○ | ○ | ○ | ○ | ○ | ○ | ○ |
| 95 | (35) | ○ | ○ | ○ | ○ | ○ | ○ | ○ |
| 96 | (36) | ○ | ○ | ○ | ○ | ○ | ○ | ○ |
| 97 | (37) | ○ | ○ | ○ | ○ | ○ | ○ | ○ |
| 98 | (38) | ○ | ○ | ○ | ○ | ○ | ○ | ○ |
| 99 | (39) | ○ | ○ | ○ | ○ | ○ | ○ | ○ |
| 100 | (40) | ○ | ○ | ○ | ○ | ○ | ○ | ○ |
| 101 | (41) | ○ | ○ | ○ | ○ | ○ | ○ | ○ |
| 102 | (42) | ○ | ○ | ○ | ○ | ○ | ○ | ○ |
| 103 | (43) | ○ | ○ | ○ | ○ | ○ | ○ | ○ |
| 104 | (44) | ○ | ○ | ○ | ○ | ○ | ○ | ○ |
| 105 | (45) | ○ | ○ | ○ | ○ | ○ | ○ | ○ |
| 106 | (46) | ○ | ○ | ○ | ○ | ○ | ○ | ○ |
| 107 | (47) | ○ | ○ | ○ | ○ | ○ | ○ | ○ |
| 108 | (48) | ○ | ○ | ○ | ○ | ○ | ○ | ○ |
| 109 | (49) | ○ | ○ | ○ | ○ | ○ | ○ | ○ |
| 110 | (50) | ○ | ○ | ○ | ○ | ○ | ○ | ○ |
| 111 | (51) | ○ | ○ | ○ | ○ | ○ | ○ | ○ |
| 112 | (52) | ○ | ○ | ○ | ○ | ○ | ○ | ○ |
| 113 | (53) | ○ | ○ | ○ | ○ | ○ | ○ | ○ |
| 114 | (54) | ○ | ○ | ○ | ○ | ○ | ○ | ○ |
| 115 | (55) | ○ | ○ | ○ | ○ | ○ | ○ | ○ |
| 116 | (56) | ○ | ○ | ○ | ○ | ○ | ○ | ○ |
| 117 | (57) | ○ | ○ | ○ | ○ | ○ | ○ | ○ |
| 118 | (58) | ○ | ○ | ○ | ○ | ○ | ○ | ○ |
| 119 | (59) | ○ | ○ | ○ | ○ | ○ | ○ | ○ |
| 120 | (60) | ○ | ○ | ○ | ○ | ○ | ○ | ○ |
| Comparative Ex. 10 | (64) | ○ | ○ | ○ | ○ | Δ | Δ | Δ |
| Comparative Ex. 11 | (65) | ○ | ○ | ○ | ○ | Δ | Δ | Δ |
| Comparative Ex. 12 | (66) | ○ | ○ | ○ | ○ | ○ | ○ | ○ |

TABLE 9

| Example No. | SiO$_2$-containing Developing Solution No. | Impairment of Image Area Immediately after start | 50 | 100 | 200 | 300 | 400 | 500 |
|---|---|---|---|---|---|---|---|---|
| 61 | (1) | ○ | ○ | ○ | ○ | ○ | ○ | ○ |
| 62 | (2) | ○ | ○ | ○ | ○ | ○ | ○ | ○ |
| 63 | (3) | ○ | ○ | ○ | ○ | ○ | ○ | ○ |
| 64 | (4) | ○ | ○ | ○ | ○ | ○ | ○ | ○ |
| 65 | (5) | ○ | ○ | ○ | ○ | ○ | ○ | ○ |
| 66 | (6) | ○ | ○ | ○ | ○ | ○ | ○ | ○ |
| 67 | (7) | ○ | ○ | ○ | ○ | ○ | ○ | ○ |
| 68 | (8) | ○ | ○ | ○ | ○ | ○ | ○ | ○ |
| 69 | (9) | ○ | ○ | ○ | ○ | ○ | ○ | ○ |
| 70 | (10) | ○ | ○ | ○ | ○ | ○ | ○ | ○ |
| 71 | (11) | ○ | ○ | ○ | ○ | ○ | ○ | ○ |
| 72 | (12) | ○ | ○ | ○ | ○ | ○ | ○ | ○ |
| 73 | (13) | ○ | ○ | ○ | ○ | ○ | ○ | ○ |
| 74 | (14) | ○ | ○ | ○ | ○ | ○ | ○ | ○ |
| 75 | (15) | ○ | ○ | ○ | ○ | ○ | ○ | ○ |
| 76 | (16) | ○ | ○ | ○ | ○ | ○ | ○ | ○ |
| 77 | (17) | ○ | ○ | ○ | ○ | ○ | ○ | ○ |
| 78 | (18) | ○ | ○ | ○ | ○ | ○ | ○ | ○ |
| 79 | (19) | ○ | ○ | ○ | ○ | ○ | ○ | ○ |
| 80 | (20) | ○ | ○ | ○ | ○ | ○ | ○ | ○ |
| 81 | (21) | ○ | ○ | ○ | ○ | ○ | ○ | ○ |
| 82 | (22) | ○ | ○ | ○ | ○ | ○ | ○ | ○ |
| 83 | (23) | ○ | ○ | ○ | ○ | ○ | ○ | ○ |
| 84 | (24) | ○ | ○ | ○ | ○ | ○ | ○ | ○ |
| 85 | (25) | ○ | ○ | ○ | ○ | ○ | ○ | ○ |

TABLE 9-continued

| Example No. | SiO$_2$-containing Developing Solution No. | Impairment of Image Area | | | | | | |
|---|---|---|---|---|---|---|---|---|
| | | Immediately after start | \multicolumn{7}{c}{Throughput (m$^2$)} | | | | | |
| | | | 50 | 100 | 200 | 300 | 400 | 500 |
| 86 | (26) | ○ | ○ | ○ | ○ | ○ | ○ | ○ |
| 87 | (27) | ○ | ○ | ○ | ○ | ○ | ○ | ○ |
| 88 | (28) | ○ | ○ | ○ | ○ | ○ | ○ | ○ |
| 89 | (29) | ○ | ○ | ○ | ○ | ○ | ○ | ○ |
| 90 | (30) | ○ | ○ | ○ | ○ | ○ | ○ | ○ |
| Comparative Ex. 7 | (61) | ○ | Δ | Δ | X | X | X | X |
| Comparative Ex. 8 | (62) | ○ | Δ | Δ | X | X | X | X |
| Comparative Ex. 9 | (63) | X | X | X | X | X | X | X |

TABLE 10

| Example No. | Nonreducing sugar-containing Developing Solution No. | Impairment of Image Area | | | | | | |
|---|---|---|---|---|---|---|---|---|
| | | Immediately after start | \multicolumn{7}{c}{Throughput (m$^2$)} | | | | | |
| | | | 50 | 100 | 200 | 300 | 400 | 500 |
| 91 | (31) | ○ | ○ | ○ | ○ | ○ | ○ | ○ |
| 92 | (32) | ○ | ○ | ○ | ○ | ○ | ○ | ○ |
| 93 | (33) | ○ | ○ | ○ | ○ | ○ | ○ | ○ |
| 94 | (34) | ○ | ○ | ○ | ○ | ○ | ○ | ○ |
| 95 | (35) | ○ | ○ | ○ | ○ | ○ | ○ | ○ |
| 96 | (36) | ○ | ○ | ○ | ○ | ○ | ○ | ○ |
| 97 | (37) | ○ | ○ | ○ | ○ | ○ | ○ | ○ |
| 98 | (38) | ○ | ○ | ○ | ○ | ○ | ○ | ○ |
| 99 | (39) | ○ | ○ | ○ | ○ | ○ | ○ | ○ |
| 100 | (40) | ○ | ○ | ○ | ○ | ○ | ○ | ○ |
| 101 | (41) | ○ | ○ | ○ | ○ | ○ | ○ | ○ |
| 102 | (42) | ○ | ○ | ○ | ○ | ○ | ○ | ○ |
| 103 | (43) | ○ | ○ | ○ | ○ | ○ | ○ | ○ |
| 104 | (44) | ○ | ○ | ○ | ○ | ○ | ○ | ○ |
| 105 | (45) | ○ | ○ | ○ | ○ | ○ | ○ | ○ |
| 106 | (46) | ○ | ○ | ○ | ○ | ○ | ○ | ○ |
| 107 | (47) | ○ | ○ | ○ | ○ | ○ | ○ | ○ |
| 108 | (48) | ○ | ○ | ○ | ○ | ○ | ○ | ○ |
| 109 | (49) | ○ | ○ | ○ | ○ | ○ | ○ | ○ |
| 110 | (50) | ○ | ○ | ○ | ○ | ○ | ○ | ○ |
| 111 | (51) | ○ | ○ | ○ | ○ | ○ | ○ | ○ |
| 112 | (52) | ○ | ○ | ○ | ○ | ○ | ○ | ○ |
| 113 | (53) | ○ | ○ | ○ | ○ | ○ | ○ | ○ |
| 114 | (54) | ○ | ○ | ○ | ○ | ○ | ○ | ○ |
| 115 | (55) | ○ | ○ | ○ | ○ | ○ | ○ | ○ |
| 116 | (56) | ○ | ○ | ○ | ○ | ○ | ○ | ○ |
| 117 | (57) | ○ | ○ | ○ | ○ | ○ | ○ | ○ |
| 118 | (58) | ○ | ○ | ○ | ○ | ○ | ○ | ○ |
| 119 | (59) | ○ | ○ | ○ | ○ | ○ | ○ | ○ |
| 120 | (60) | ○ | ○ | ○ | ○ | ○ | ○ | ○ |
| Comparative Ex. 10 | (64) | ○ | Δ | Δ | X | X | X | X |
| Comparative Ex. 11 | (65) | ○ | Δ | Δ | X | X | X | X |
| Comparative Ex. 12 | (66) | X | X | X | X | X | X | X |

The alkaline developing solution according to the present invention can exhibit a certain performance, even if components of an image recording layer dissolve into the developing solution. Therefore, the alkaline developing solution according to the present invention makes possible to process stably a lithographic printing plate precursor in extended periods of time. The plate making method using the above developing solution can form a highly sharp and clear image in a lithographic printing plate without damages to the image areas, simultaneously favorable developing performance to the non-image areas being retained.

What is claimed is:

1. An alkaline developing solution for development of a heat-sensitive presensitized plate of positive-working mode for use in making a lithographic printing plate, which developing solution comprises a linear alkyleneoxide adduct and a branched alkyleneoxide adduct wherein the branched alkyleneoxide adduct is selected from the compound having in the molecular structure thereof at least two groups represented by the following formula (II):

-(A)m-(B)n-H  (II)

wherein A and B each represents —$CH_2CH_2O$— or —$CH_2CH(CH_3)O$— provided that A and B are different from each other, and m and n each represents 0 or an integer of from 1 to 50 provided that m and n are not zero at the same time.

2. The alkaline developing solution according to claim 1 wherein the linear alkyleneoxide adduct is selected from the compounds represented by the following general formula (I):

R—O-(A)m-(B)n-H  (I)

wherein R represents a hydrogen atom, an alkyl or alkenyl group having carbon atoms of from 1 to 30, or an aryl group having carbon atoms of from 6 to 48, A and B each represents —$CH_2CH_2O$— or —$CH_2CH(CH_3)O$— provided that A and B are different from each other, and m and n each represents 0 or an integer of from 1 to 50 provided that m and n are not zero at the same time.

3. The alkaline developing solution according to claim 1 wherein the linear alkyleneoxide adduct is selected from the group consisting of compounds represented by the following formula (1), (2), (3), (4), (5) or (6):

(1) HO-(A)m-(B)n-H (wherein A and B each represents —$CH_2CH_2O$— or —$CH_2CH(CH_3)O$— provided that A and B are different from each other, and m and n each represents 0 or an integer of from 1 to 50 provided that m and n are not zero at the same time;

(2) $C_pH_{2p+1}$—O-(A)m-(B)n-H (wherein A and B each represents —$CH_2CH_2O$— or —$CH_2CH(CH_3)O$— provided that A and B are different from each other, and m and n each represents 0 or an integer of from 1 to 50 provided that m and n are not zero at the same time, and p is an integer of from 1 to 30;

(3) $C_qH_{2q-1}$—O-(A)m-(B)n-H (wherein A and B each represents —$CH_2CH_2O$— or —$CH_2CH(CH_3)O$— provided that A and B are different from each other, and m and n each represents 0 or an integer of from 1 to 50 provided that m and n are not zero at the same time, and q is an integer of from 2 to 30;

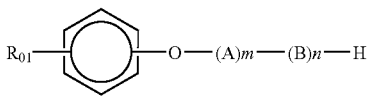

(4)

(wherein $R_{01}$ represents a hydrogen atom or an alkyl group having carbon atoms of from 1 to 20 which may be in the form of linear or branched chain, A and B each represents —$CH_2CH_2O$— or —$CH_2CH(CH_3)O$— provided that A and B are different from each other, and m and n each represents 0 or an integer of from 1 to 50 provided that m and n are not zero at the same time;

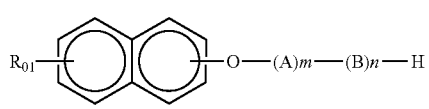

(5)

(wherein $R_{01}$ represents a hydrogen atom or an alkyl group having carbon atoms of from 1 to 20 which may be in the form of linear or branched chain, A and B each represents —$CH_2CH_2O$— or —$CH_2CH(CH_3)O$— provided that A and B are different from each other, and m and n each represents 0 or an integer of from 1 to 50 provided that m and n are not zero at the same time;

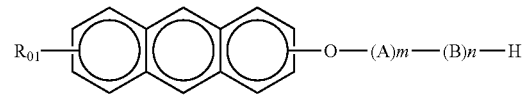

(6)

(wherein $R_{01}$ represents a hydrogen atom or an alkyl group having carbon atoms of from 1 to 20 which may be in the form of linear or branched chain, A and B each represents —$CH_2CH_2O$— or —$CH_2CH(CH_3)O$— provided that A and B are different from each other, and m and n each represents 0 or an integer of from 1 to 50 provided that m and n are not zero at the same time.

4. The alkaline developing solution of claim 1 wherein the branched alkyleneoxide adduct is selected from the group consisting of compound (1) having in the molecular structure thereof at least two of the group: —O-(A)m-(B)n-H (wherein A and B each represents —$CH_2CH_2O$— or —$CH_2CH(CH_3)O$— provided that A and B are different from each other, and m and n each represents 0 or an integer of from 1 to 50 provided that m and n are not zero at the same time, and compound (2) having in the molecular structure thereof a nitrogen atom and at least two of the group: -(A)m-(B)n-H (wherein A and B each represents —$CH_2CH_2O$— or —$CH_2CH(CH_3)O$— provided that A and B are different from each other, and m and n each represents 0 or an integer of from 1 to 50 provided that m and n are not zero at the same time, said group being attached to the nitrogen atom.

5. The alkaline developing solution of claim 1 wherein the branched alkyleneoxide adduct is selected from the group consisting of compounds represented by the following formula (III), compounds represented by the following formula (IV), compounds represented by the following formula (IV'), alkyleneoxide adduct of polyglycerin, and trimethylolpropyl ether alkyleneoxide adducts:

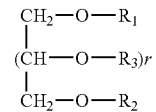

(III)

wherein r represents an integer of from 1 to 10, and $R_1$, $R_2$ and $R_3$ each represent a hydrogen atom or the following formula (II):

-(A)m-(B)n-H  (II)

wherein A and B each represents —$CH_2CH_2O$— or —$CH_2CH(CH_3)O$— provided that A and B are different from each other, and m and n each represents 0 or an integer of from 1 to 50 provided that m and n are not zero at the same time, provided that at least two of $R_1$, $R_2$ and $R_3$ represent the group represented by the formula (II),

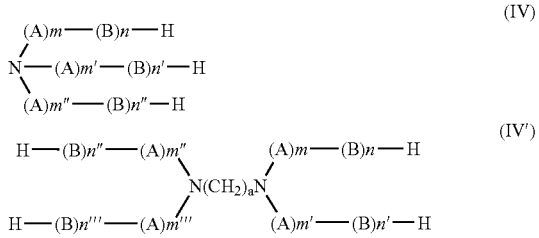

(IV)

(IV')

wherein A and B each represents —CH$_2$CH$_2$O— or —CH$_2$CH(CH$_3$)O— provided that A and B are different from each other, and m and n each represents 0 or an integer of from 1 to 50 provided that m and n are not zero at the same time, m' and n' each represents 0 or an integer of from 1 to 50 provided that m' and n' are not zero at the same time, M" and n" each represents 0 or an integer of from 1 to 50 provided that m" and n" are not zero at the same time, and m'" and n'" each represents 0 or an integer of from 1 to 50 provided that in'" and n'" are not zero at the same time, and "a" in the formula (IV') is an integer of from 2 to 12.

6. The alkaline developing solution according to claim 1 which further comprises at least one selected from the group consisting of anionic surfactants and amphoteric surfactants.

7. The alkaline developing solution of claim 6 wherein the anionic surfactant is selected from the group consisting of fatty alcohol sulfuric ester salts, higher alkyl ether sulfate salts, aryl ether sulfate salts, alkyl aryl sulfonate, aliphatic alcohol phosphoric ester salts, alkyl amide sulfonate salts, sulfonate salts of dibasic aliphatic ester, hydroxyalkane sulfonate salts, alkane sulfonate salts, alkyl diphenylether sulfonate salts, diphenylether disulfonate salts, dialkyl sulfosuccinate salts, olefin sulfonate salts, linear alkyl benzene sulfonate salts, branched alkyl benzene sulfonate salts, alkyl naphthalene sulfonate salts, alkyl phenoxy polyoxyethylene propyl sulfonate salts, polyoxyethylene alkyl sulfophenylether salts, disodium N-alkyl sulfosuccinate monoamide and petroleum sulfonates.

8. The alkaline developing solution of claim 6 wherein the amphoteric surfactant is selected from the group consisting of amino acid amphoteric surfactants and betaine amphoteric surfactants.

9. A method for preparing a lithographic printing plate comprising the steps of light-exposing to infrared radiation, a heat-sensitive presensitized plate of positive-working mode for use in making a lithographic printing plate, said presensitized plate having an image recording layer which comprises an IR-absorbing dye on a substrate, and developing the light-exposed plate with an alkaline developing solution which comprises a linear alkyleneoxide adduct and a branched alkyleneoxide adduct adduct wherein the branched alkyleneoxide adduct is selected from the compound having in the molecular structure thereof at least two groups reDresented by the following formula (II):

-(A)m-(B)n-H    (II)

wherein A and B each represents —CH$_2$CH$_2$O— or —CH$_2$CH(CH$_3$)O— provided that A and B are different from each other, and m and n each represents 0 or an integer of from 1 to 50 Drovided that m and n are not zero at the same time.

10. The method of claim 9 wherein the linear alkyleneoxide adduct is selected from the compounds represented by the following general formula (I):

R—O-(A)m-(B)n-H    (I)

wherein R represents a hydrogen atom, an alkyl or alkenyl group having carbon atoms of from 1 to 30, or an aryl group having carbon atoms of from 6 to 48, A and B each represents —CH$_2$CH$_2$O— or —CH$_2$CH(CH$_3$)O— provided that A and B are different from each other, and m and n each represents 0 or an integer of from 1 to 50 provided that m and n are not zero at the same time.

11. The method of claim 9 wherein the linear alkyleneoxide adduct is selected from the group consisting of compounds represented by the following formula (1), (2), (3), (4), (5) or (6):

(1) HO-(A)m-(B)n-H (wherein A and B each represents —CH$_2$CH$_2$O— or —CH$_2$CH(CH$_3$)O— provided that A and B are different from each other, and m and n each represents 0 or an integer of from 1 to 50 provided that m and n are not zero at the same time;

(2) C$_p$H$_{2p+}$—O-(A)m-(B)n-H (wherein A and B each represents —CH$_2$CH$_2$O— or —CH$_2$CH(CH$_3$)O— provided that A and B are different from each other, and m and n each represents 0 or an integer of from 1 to 50 provided that m and n are not zero at the same time, and p is an integer of from 1 to 30;

(3) C$_q$H$_{2q-1}$—O-(A)m-(B)n-H (wherein A and B each represents —CH$_2$CH$_2$O— or —CH$_2$CH(CH$_3$)O— provided that A and B are different from each other, and m and n each represents 0 or an integer of from 1 to 50 provided that m and n are not zero at the same time, and q is an integer of from 2to 30;

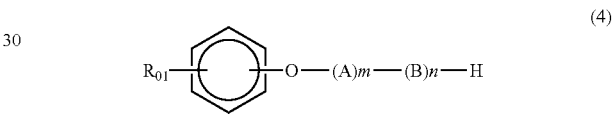

(4)

(wherein R$_{01}$ represents a hydrogen atom or an alkyl group having carbon atoms of from 1 to 20 which may be in the form of linear or branched chain, A and B each represents —CH$_2$CH$_2$O— or —CH$_2$CH(CH$_3$)O— provided that A and B are different from each other, and m and n each represents 0 or an integer of from 1 to 50 provided that m and n are not zero at the same time;

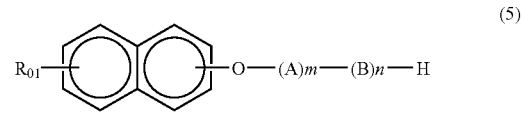

(5)

(wherein R$_{01}$ represents a hydrogen atom or an alkyl group having carbon atoms of from 1 to 20 which may be in the form of linear or branched chain, A and B each represents —CH$_2$CH$_2$O— or —CH$_2$CH(CH$_3$)O— provided that A and B are different from each other, and m and n each represents 0 or an integer of from 1 to 50 provided that m and n are not zero at the same time;

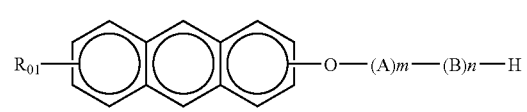

(6)

(wherein R$_{01}$ represents a hydrogen atom or an alkyl group having carbon atoms of from 1 to 20 which may be in the form of linear or branched chain, A and B each represents —CH$_2$CH$_2$O— or —CH$_2$CH(_0H$_3$)O— provided that A and B are different from each other, and m and n each represents 0 or an integer of from 1 to 50 provided that m and n are not zero at the same time.

12. The method of claim 9 wherein the branched alkyleneoxide adduct is selected from the group consisting of compound (1) having in the molecular structure thereof at least two of the group: —O-(A)m-(B)n-H (wherein A and B each represents —CH$_2$CH$_2$O— or —CH$_2$CH(CH$_3$)O— provided that A and B are different from each other, and m and n each represents 0 or an integer of from 1 to 50 provided that m and n are not zero at the same time, and compound (2) having in the molecular structure thereof a nitrogen atom and at least two of the group: -(A)m-(B)n-H (wherein A and B each represents —CH$_2$CH$_2$O— or —CH$_2$CH(CH$_3$)O— provided that A and B are different from each other, and m and n each represents 0 or an integer of from 1 to 50 provided that m and n are not zero at the same time, said group being attached to the nitrogen atom.

13. The method of claim 9 wherein the branched alkyleneoxide adduct is selected from the group consisting of compounds represented by the following formula (III), compounds represented by the following formula (IV), compounds represented by the following formula (IV'), alkyleneoxide adduct of polyglycerin, and trimethylolpropyl ether alkyleneoxide adducts:

wherein r represents an integer of from 1 to 10, and R$_1$, R$_2$ and R$_3$ each represent hydrogen atom or the following formula (II):

wherein A and B each represents —CH$_2$CH$_2$O— or —CH$_2$CH(CH$_3$)O— provided that A and B are different from each other, and m and n each represents 0 or an integer of from 1 to 50 provided that m and n are not zero at the same time, provided that at least two of R$_1$, R$_2$ and R$_3$ represent the group represented by the formula (II),

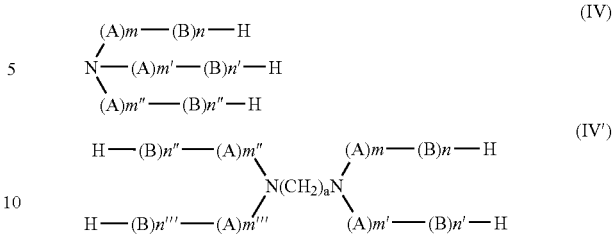

wherein A and B each represents —CH$_2$CH$_2$O— or —CH$_2$CH(CH$_3$)O— provided that A and B are different from each other, and m and n each represents 0 or an integer of from 1 to 50 provided that m and n are not zero at the same time, m' and n' each represents 0 or an integer of from 1 to 50 provided that m' and n' are not zero at the same time, m'' and n'' each represents 0 or an integer of from 1 to 50 provided that m''' and n''' are not zero at the same time, and m'''' and n'''' each represents 0 or an integer of from 1 to 50 provided that m''' and n''' are not zero at the same time, and "a" in the formula (IV') is an integer of from 2 to 12.

14. The method of claim 9 wherein the alkaline developing solution further comprises at least one selected from the group consisting of anionic surfactants and ainphoteric surfactants.

15. The method of claim 14 wherein the anionic surfactant is selected from the group consisting of fatty alcohol sulfuric ester salts, higher alkyl ether sulfate salts, aryl ether sulfate salts, alkyl aryl sulfonate, aliphatic alcohol phosphoric ester salts, alkyl amide sulfonate salts, sulfonate salts of dibasic aliphatic ester, hydroxyalkane sulfonate salts, alkane sulfonate salts, alkyl diphenylether sulfonate salts, diphenylether disulfonate salts, dialkyl sulfosuccinate salts, olefin sulfonate salts, linear alkyl benzene sulfonate salts, branched alkyl benzene sulfonate salts, alkyl naphthalene sulfonate salts, alkyl phenoxy polyoxyethylene propyl sulfonate salts, polyoxyethylene alkyl sulfophenylether salts, disodium N-alkyl sulfosuccinate monoamide and petroleum sulfonates.

16. The method of claim 14 wherein the amphoteric surfactant is selected from the group consisting of amino acid amphoteric surfactants and betaine amphoteric surfactants.

* * * * *

UNITED STATES PATENT AND TRADEMARK OFFICE
CERTIFICATE OF CORRECTION

| | |
|---|---|
| PATENT NO. | : 7,147,995 B2 |
| APPLICATION NO. | : 10/798365 |
| DATED | : December 12, 2006 |
| INVENTOR(S) | : Takamiya |

Page 1 of 1

It is certified that error appears in the above-identified patent and that said Letters Patent is hereby corrected as shown below:

On Title Page Item (73) Assignee: change "Minami-Ashigari" to --Minami-Ashigara--.

Signed and Sealed this

Twentieth Day of March, 2007

JON W. DUDAS
*Director of the United States Patent and Trademark Office*